US012684864B2

(12) United States Patent
Sung et al.

(10) Patent No.: US 12,684,864 B2
(45) Date of Patent: Jul. 14, 2026

(54) SEMICONDUCTOR DEVICE

(71) Applicant: SAMSUNG ELECTRONICS CO., LTD., Suwon-si (KR)

(72) Inventors: Yoo Ri Sung, Suwon-si (KR); Ju Youn Kim, Suwon-si (KR); Myung Soo Seo, Suwon-si (KR); Ki Hwan Lee, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 620 days.

(21) Appl. No.: 18/165,486

(22) Filed: Feb. 7, 2023

(65) Prior Publication Data

US 2023/0402456 A1     Dec. 14, 2023

(30) Foreign Application Priority Data

Jun. 13, 2022 (KR) ........................ 10-2022-0071340

(51) Int. Cl.
*H10D 84/85* (2025.01)
*H10D 84/01* (2026.01)
*H10D 84/03* (2025.01)

(52) U.S. Cl.
CPC ......... *H10D 84/85* (2025.01); *H10D 84/0167* (2025.01); *H10D 84/0184* (2025.01); *H10D 84/038* (2025.01)

(58) Field of Classification Search
CPC ............... H10D 84/85; H10D 84/0167; H10D 84/0174; H10D 84/038; H10D 84/853; H10D 30/6757; H10D 30/43; H10D 30/014; H10D 30/6735; H10D 64/017; H10D 64/671; H10D 62/364; H10D 62/121; H10D 62/832; B82Y 10/00
See application file for complete search history.

(56) References Cited

U.S. PATENT DOCUMENTS

| | | | |
|---|---|---|---|
| 9,502,500 B2 | 11/2016 | Leobandung | |
| 9,570,809 B2 | 2/2017 | Obradovic et al. | |
| 9,576,866 B2 | 2/2017 | Zang et al. | |
| 9,704,995 B1 | 7/2017 | Schultz | |
| 10,242,920 B2 | 3/2019 | Guillorn et al. | |
| 10,249,541 B2 | 4/2019 | Cheng et al. | |

(Continued)

FOREIGN PATENT DOCUMENTS

KR        10-20160068680        6/2016

*Primary Examiner* — Calvin Y Choi
(74) *Attorney, Agent, or Firm* — MORGAN, LEWIS & BOCKIUS LLP

(57) ABSTRACT

A semiconductor device includes a substrate that includes a first region and a second region, a first active pattern on the first region and that extends in a first horizontal direction, a second active pattern on the second region and that extends in the first horizontal direction, a first etch stop layer on the first active pattern, a second etch stop layer on the second active pattern, a plurality of first nanosheets on the first etch stop layer and that are stacked in a vertical direction and include silicon germanium (SiGe), a plurality of second nanosheets on the second etch stop layer and that are stacked in the vertical direction, a first gate electrode on the first etch stop layer and that extends in a second horizontal direction, and a second gate electrode disposed on the second etch stop layer and that extends in the second horizontal direction.

20 Claims, 30 Drawing Sheets

(56)      References Cited

U.S. PATENT DOCUMENTS

| | | | |
|---|---|---|---|
| 10,263,100 B1 | 4/2019 | Bi et al. | |
| 10,319,863 B2 | 6/2019 | Lee et al. | |
| 10,396,181 B2 | 8/2019 | Bergendahl et al. | |
| 10,535,738 B2 | 1/2020 | Hsiao et al. | |
| 10,593,673 B2 | 3/2020 | Miao et al. | |
| 10,714,392 B2 | 7/2020 | Loubet et al. | |
| 2018/0175035 A1 | 6/2018 | Yang et al. | |
| 2019/0341450 A1 | 11/2019 | Lee et al. | |
| 2021/0233909 A1* | 7/2021 | Bao | H10D 30/6743 |
| 2021/0408284 A1 | 12/2021 | Agrawal et al. | |
| 2022/0029024 A1 | 1/2022 | More et al. | |
| 2022/0149176 A1* | 5/2022 | More | H10D 30/6713 |
| 2022/0165730 A1 | 5/2022 | Chen et al. | |

* cited by examiner

SEMICONDUCTOR DEVICE

CROSS-REFERENCE TO RELATED APPLICATION

This application claims priority under 35 U.S.C. 119 from Korean Patent Application No. 10-2022-0071340, filed on Jun. 13, 2022 in the Korean Intellectual Property Office, the contents of which are herein incorporated by reference in their entirety.

TECHNICAL FIELD

Embodiments of the present disclosure are directed to a semiconductor device.

DISCUSSION OF THE RELATED ART

One of scaling schemes for increasing an integration density of a semiconductor device is to use a multi-gate transistor in which a silicon body in a shape of a fin or a nanowire is formed on a substrate, and a gate is formed on a surface of the silicon body.

Because such a multi-gate transistor uses a three-dimensional channel, it is easy to scale the same. Further, current control capability of a multi-gate transistor can be improved without increasing a gate length of the multi-gate transistor. In addition, a multi-gate transistor can effectively suppress a SCE (short channel effect) in which a potential of a channel region is affected by drain voltage.

SUMMARY

Embodiments of the present disclosure provide a semiconductor device in which a nanosheet formed in a PMOS region include silicon germanium (SiGe), thereby preventing a source/drain region from being etched during a replacement metal gate (RMG) process. Thus, leakage current between a gate electrode and the source/drain region may be reduced.

Further, embodiments of the present disclosure provide a semiconductor device in which an etch stop layer that includes an insulating material is formed under a nanosheet of a PMOS region, thereby preventing an active pattern that includes silicon (Si) from being etched during a replacement metal gate (RMG) process.

According to some embodiments of the present disclosure, there is provided a semiconductor device that includes a substrate that includes a first region and a second region defined therein, a first active pattern disposed on the first region of the substrate and that extends in a first horizontal direction, a second active pattern disposed on the second region of the substrate and that extends in the first horizontal direction, a first etch stop layer disposed on the first active pattern and that includes an insulating material, a second etch stop layer disposed on the second active pattern and that includes an insulating material, a plurality of first nanosheets disposed on the first etch stop layer, where the plurality of first nanosheets are stacked and spaced apart from each other in a vertical direction and include silicon germanium (SiGe), a plurality of second nanosheets disposed on the second etch stop layer, where the plurality of second nanosheets are stacked and spaced apart from each other in the vertical direction, a first gate electrode disposed on the first etch stop layer and that extends in a second horizontal direction that differs from the first horizontal direction, where the first gate electrode surrounds the plurality of first nanosheets, and a second gate electrode disposed on the second etch stop layer and that extends in the second horizontal direction, where the second gate electrode surrounds the plurality of second nanosheets.

According to some embodiments of the present disclosure, there is provided a semiconductor device that includes a substrate that includes a PMOS region and a NMOS region formed therein, a first active pattern disposed on the PMOS region of the substrate and that extends in a first horizontal direction, a second active pattern disposed on the NMOS region of the substrate and that extends in the first horizontal direction, a first etch stop layer disposed on the first active pattern and that includes an insulating material, a second etch stop layer disposed on the second active pattern and that includes an insulating material, where the first and second etch stop layers have a same vertical level above the substrate, a plurality of first nanosheets disposed on the first etch stop layer, where the plurality of first nanosheets are stacked and spaced apart from each other in a vertical direction and include silicon germanium (SiGe), a plurality of second nanosheets disposed on the second etch stop layer, where the plurality of second nanosheets are stacked and spaced apart from each other in the vertical direction, a first source/drain region disposed on the first active pattern and on at least one side surface of the plurality of first nanosheets, where the first source/drain region is in contact with the first etch stop layer, and a second source/drain region disposed on the second active pattern and on at least one side surface of the plurality of second nanosheets, where the second source/drain region is in contact with the second etch stop layer.

According to some embodiments of the present disclosure, there is provided a semiconductor device that includes a substrate that includes a PMOS region and a NMOS region formed therein, a first active pattern disposed on the PMOS region of the substrate and that extends in a first horizontal direction, a second active pattern disposed on the NMOS region of the substrate and that extends in the first horizontal direction, a first etch stop layer disposed on the first active pattern and that includes an insulating material, a second etch stop layer disposed on the second active pattern and that includes an insulating material, where the first and second etch stop layers have as same vertical level above the substrate, a plurality of first nanosheets disposed on the first etch stop layer, where the plurality of first nanosheets are stacked and spaced apart from each other in a vertical direction and include silicon germanium (SiGe), a plurality of second nanosheets disposed on the second etch stop layer, where the plurality of second nanosheets are stacked and spaced apart from each other in the vertical direction and include silicon (Si) and vertical levels of the plurality of second nanosheets differ from vertical levels of the plurality of first nanosheets, a first gate electrode disposed on the first etch stop layer and that extends in a second horizontal direction that differs from the first horizontal direction, where the first gate electrode surrounds the plurality of first nanosheets, a second gate electrode disposed on the second etch stop layer and that extends in the second horizontal direction, where the second gate electrode surrounds the plurality of second nanosheets, a first source/drain region disposed on the first active pattern and on at least one side surface of the first gate electrode, where the first source/drain region is in contact with the first etch stop layer, and a second source/drain region disposed on the second active pattern and on at least one side surface of the second gate electrode, where the second source/drain region is in contact with the second etch stop layer.

DETAILED DESCRIPTION

Hereinafter, a semiconductor device according to some embodiments of the present disclosure will be described with reference to FIG. 1 to FIG. 3.

Figure 1:
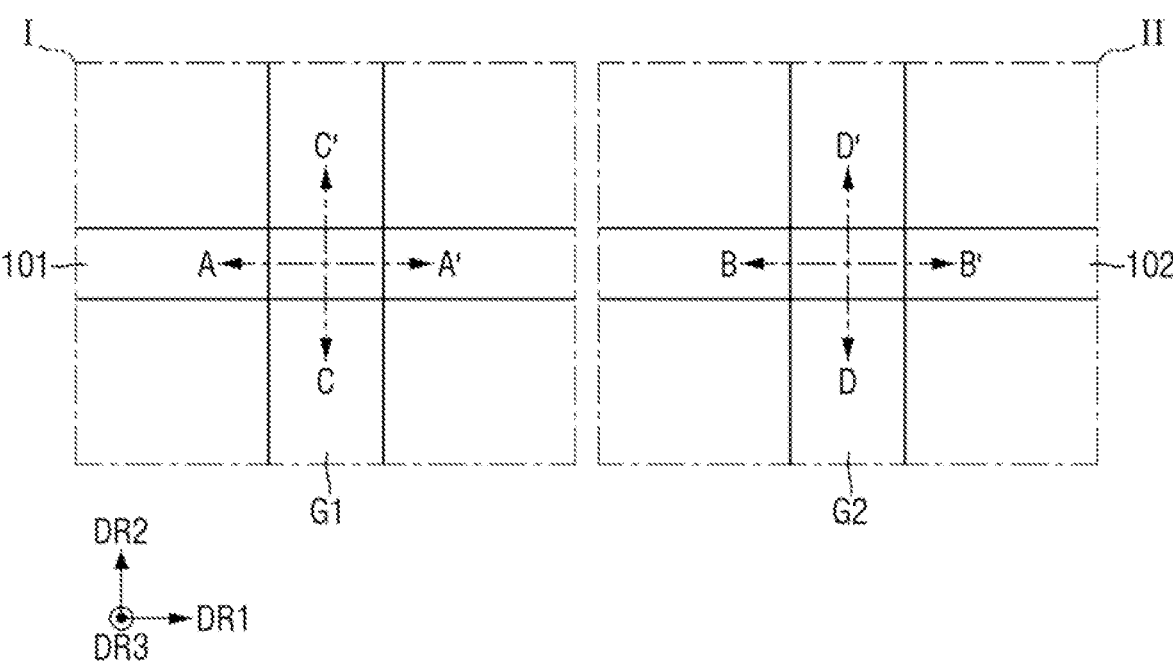
FIG. 1 is a layout diagram of a semiconductor device according to some embodiments of the present disclosure.

FIG. 1 is a layout diagram of a semiconductor device according to some embodiments of the present disclosure. FIG. 2 is a cross-sectional view taken along lines A-A' and B-B' in FIG. 1. FIG. 3 is a cross-sectional view taken along a line C-C' and a line D-D' in FIG. 1.

Figure 2:
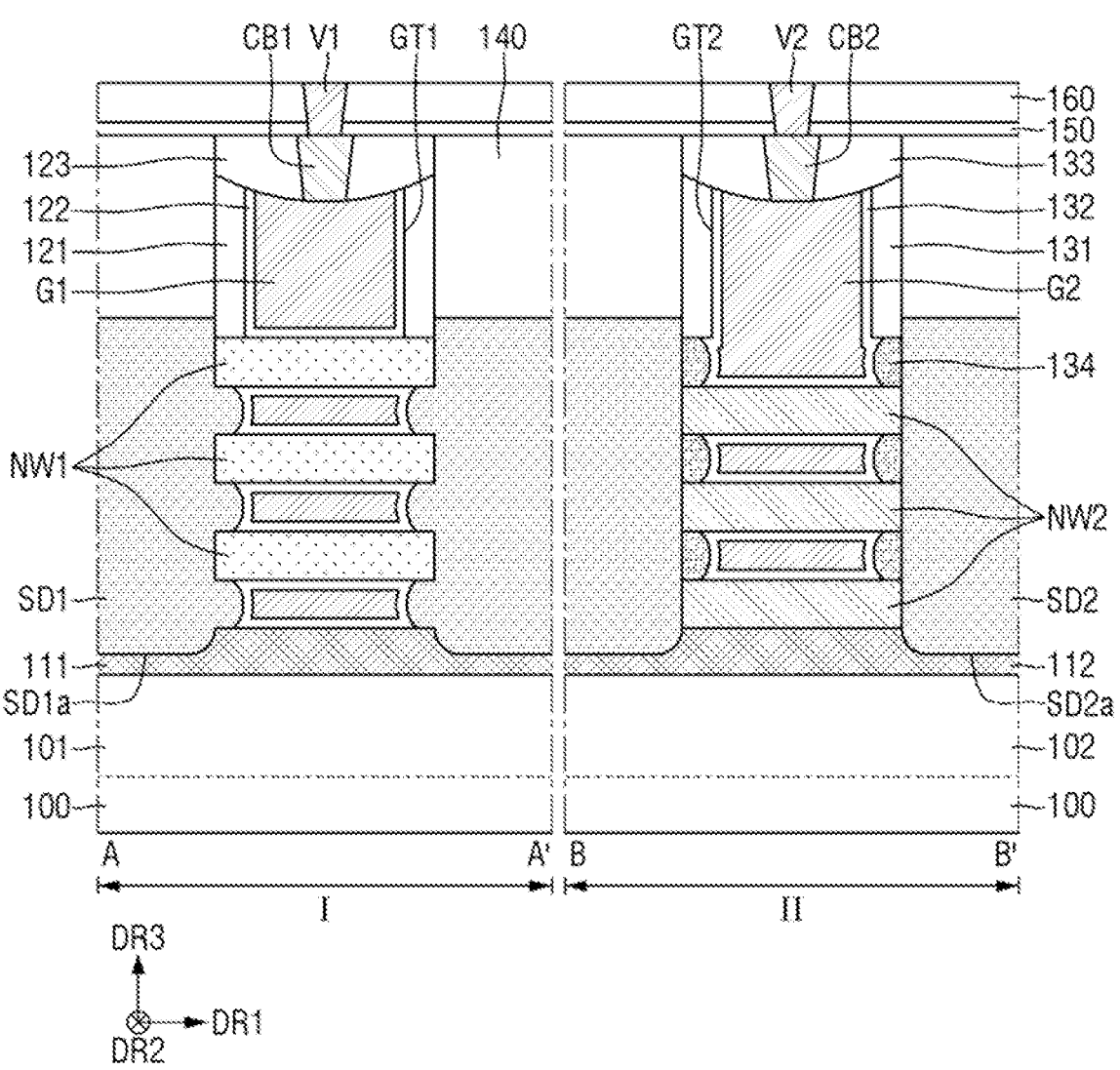
FIG. 2 is a cross-sectional view taken along lines A-A' and B-B' in FIG. 1.
Figure 3:
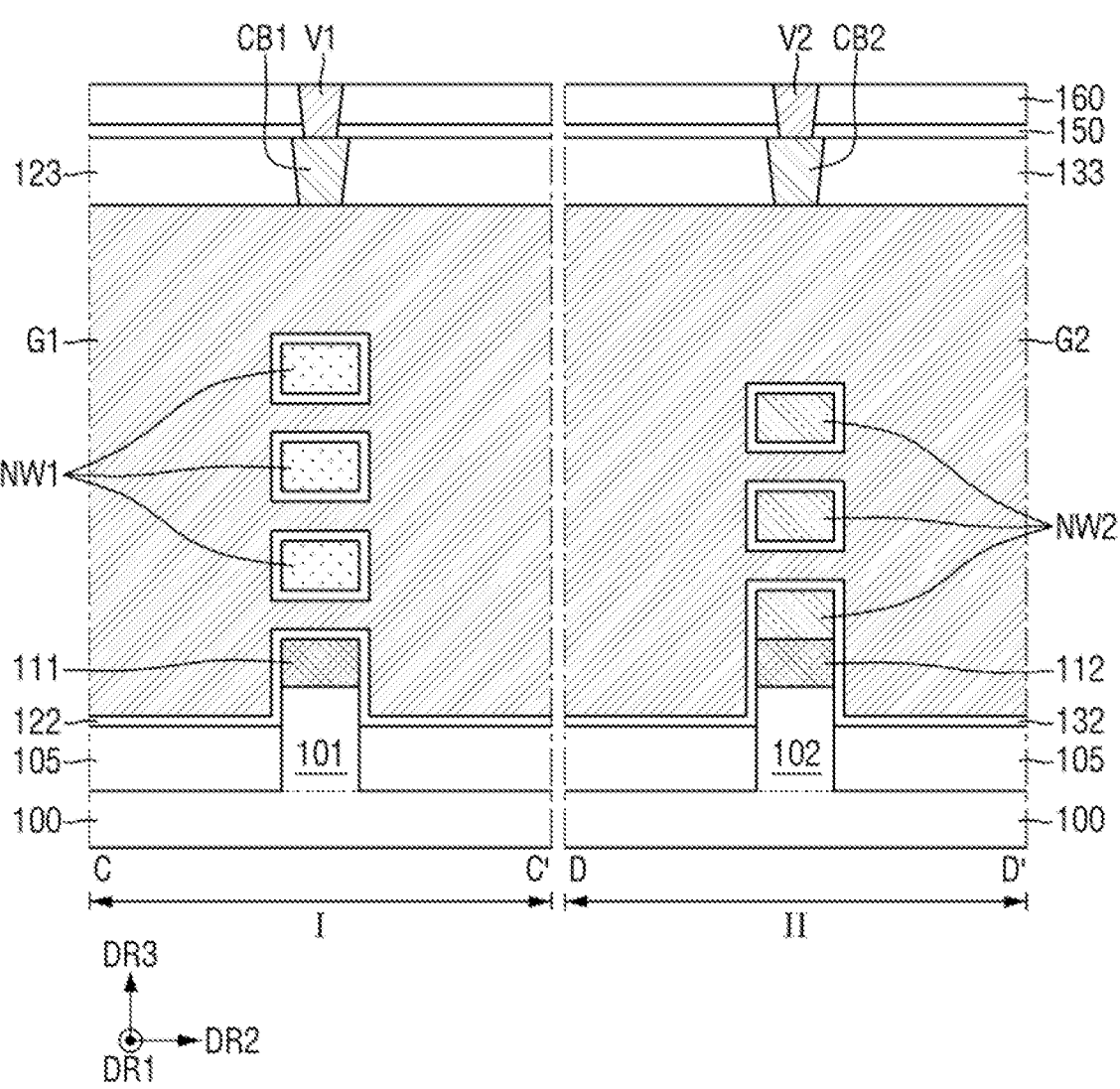
FIG. 3 is a cross-sectional view taken along a line C-C' and a line D-D' in FIG. 1.

Referring to FIG. 1 to FIG. 3, a semiconductor device according to some embodiments of the present disclosure includes a substrate 100, first and second active patterns 101 and 102, a field insulating layer 105, a plurality of first and second nanosheets NW1 and NW2, first and second gate electrodes G1 and G2, first and second etch stop layers 111 and 112, first and second gate spacers 121 and 131, first and second gate insulating layers 122 and 132, first and second capping patterns 123 and 133, an inner spacer 134, first and second source/drain regions SD1 and SD2, a first interlayer insulating layer 140, first and second gate contacts CB1 and CB2, a third etch stop layer 150, a second interlayer insulating layer 160, a first gate trench GT1 and a second gate trench GT2, and first and second vias V1 and V2.

In an embodiment, the substrate 100 is a silicon substrate or an SOI (silicon-on-insulator). Alternatively, in some embodiments, the substrate 100 includes one or more of silicon germanium, SGOI (silicon germanium on insulator), indium antimonide, lead telluride, indium arsenide, indium phosphide, gallium arsenide, or gallium antimonide. However, embodiments of the present disclosure are not necessarily limited thereto.

The substrate 100 includes a first region I and a second region II. For example, the first region I of the substrate 100 is a PMOS region. For example, a PMOS transistor is formed on the first region I of the substrate 100. For example, the second region II of the substrate 100 is an NMOS region. For example, an NMOS transistor is formed on the second region II of the substrate 100.

The first active pattern 101 is disposed on the first region I of the substrate 100 and extends in a first horizontal direction DR1. The second active pattern 102 is disposed on the second region II of the substrate 100 and extends in the first horizontal direction DR1. Each of the first and second active patterns 101 and 102 protrudes from the substrate 100 in a vertical direction DR3. Hereinafter, a second horizontal direction DR2 is a direction that differs from or crosses the first horizontal direction DR1. The vertical direction DR3 is a direction perpendicular to a plane defined by the first and second horizontal directions DR1 and DR2.

Each of the first and second active patterns 101 and 102 may be a portion of the substrate 100, or may include an epitaxial layer grown from the substrate 100. Each of the first and second active patterns 101 and 102 includes, for example, silicon or germanium as an elemental semiconductor material. Further, each of the first and second active patterns 101 and 102 includes a compound semiconductor. For example, the compound semiconductor includes at least one of a group IV-IV compound semiconductor or a group III-V compound semiconductor.

The field insulating layer 105 is disposed on the substrate 100. The field insulating layer 105 surrounds a sidewall of each of the first and second active patterns 101 and 102. Each of the first and second active patterns 101 and 102 protrudes in the vertical direction DR3 above an upper surface of the field insulating layer 105. However, embodiments of the present disclosure are not necessarily limited thereto. The field insulating layer 105 includes, for example, at least one of an oxide film, a nitride film, an oxynitride film, or a combination film thereof.

The first etch stop layer 111 is disposed on the first active pattern 101. The first etch stop layer 111 extends in the first horizontal direction DR1. The first etch stop layer 111 overlaps the first active pattern 101 in the vertical direction DR3. For example, a sidewall in the second horizontal direction DR2 of the first etch stop layer 111 is aligned in the vertical direction DR3 with a sidewall in the second horizontal direction DR2 of the first active pattern 101. For example, a vertical level of a bottom surface of the first etch stop layer 111 is higher than that of an upper surface of the field insulating layer 105.

The second etch stop layer 112 is disposed on the second active pattern 102. The second etch stop layer 112 extends in the first horizontal direction DR1. The second etch stop layer 112 overlaps the second active pattern 102 in the vertical direction DR3. For example, a sidewall in the second horizontal direction DR2 of the second etch stop layer 112 is aligned in the vertical direction DR3 with a sidewall in the second horizontal direction DR2 of the second active pattern 102. For example, a vertical level of a bottom surface of the second etch stop layer 112 may be higher than that of an upper surface of the field insulating layer 105. For example, a vertical level of the second etch stop layer 112 is the same as a vertical level of the first etch stop layer 111. A vertical level of a layer means a vertical dimension from an upper surface of the substrate 100 to a bottom surface of the layer. Hereinafter, a vertical level of a layer means a vertical dimension from an upper surface of the substrate 100 to a bottom surface of the layer.

Each of the first and second etch stop layers 111 and 112 includes an insulating material. For example, each of the first and second etch stop layers 111 and 112 includes at least one of silicon oxide, silicon nitride, silicon oxynitride, silicon carbonitride, silicon oxycarbonitride, or a low-k material (low dielectric constant material). In FIG. 2 and FIG. 3, each of the first and second etch stop layers 111 and 112 is illustrated as a single layer. However, embodiments of the present disclosure are not necessarily limited thereto. In some embodiments, each of the first and second etch stop layers 111 and 112 includes multiple layers.

The plurality of first nanosheets NW1 are disposed on the first etch stop layer 111. The plurality of first nanosheets NW1 include a plurality of nanosheets stacked on top of each other and spaced apart from each other in the vertical direction DR3. The plurality of first nanosheets NW1 are disposed in a region where the first active pattern 101 and the first gate electrode G1 intersect each other.

For example, the lowermost nanosheet of the plurality of first nanosheets NW1 is spaced above the first etch stop layer 111 in the vertical direction DR3. For example, a sidewall in the second horizontal direction DR2 of each of the plurality of first nanosheets NW1 is aligned in the vertical direction DR3 with a sidewall in the second horizontal direction DR2 of the first etch stop layer 111. Each of the plurality of first nanosheets NW1 includes silicon germanium (SiGe).

The plurality of second nanosheets NW2 are disposed on the second etch stop layer 112. The plurality of second nanosheets NW2 include a plurality of nanosheets stacked on top of each other and spaced apart from each other in the vertical direction DR3. The plurality of second nanosheets NW2 are disposed in a region where the second active pattern 102 and the second gate electrode G2 intersect each other.

For example, the lowermost nanosheet of the plurality of second nanosheets NW2 is in contact with an upper surface of the second etch stop layer 112. For example, a sidewall in the second horizontal direction DR2 of each of the plurality of second nanosheets NW2 is aligned in the vertical direction DR3 with a sidewall in the second horizontal direction DR2 of the second etch stop layer 112.

Each of the plurality of second nanosheets NW2 and each of the plurality of first nanosheets NW1 are disposed at different levels. For example, a vertical level of an uppermost nanosheet of the plurality of second nanosheets NW2 is lower than that of an uppermost nanosheet of the plurality of first nanosheets NW1. Each of the plurality of second nanosheets NW2 includes a material that differs from a material of each of the plurality of first nanosheets NW1. For example, each of the s plurality of second nanosheets NW2 includes silicon (Si).

FIG. 2 and FIG. 3 illustrate that each of the plurality of first and second nanosheets NW1 and NW2 includes three nanosheets stacked on top of each other and spaced apart from each other in the vertical direction DR3. However, this is for convenience of illustration, and embodiments of the present disclosure are not necessarily limited thereto. In some embodiments, each of the plurality of first and second nanosheets NW1 and NW2 includes four or more nanosheets stacked on top of each other and spaced apart from each other in the vertical direction DR3.

The first gate spacer 121 is disposed on the first region I of the substrate 100. The first gate spacer 121 extends in the second horizontal direction DR2 and is disposed on the uppermost nanosheet of the plurality of first nanosheets NW1 and the field insulating layer 105. For example, the first gate spacer 121 is in contact with an upper surface of the uppermost nanosheet of the plurality of first nanosheets NW1. The first gate spacer 121 includes two spacers spaced apart from each other in the first horizontal direction DR1. The first gate trench GT1 is formed between the two spacers of the first gate spacer 121.

The second gate spacer 131 is disposed on the second region II of the substrate 100. The second gate spacer 131 extends in the second horizontal direction DR2 and is disposed on the uppermost nanosheet of the plurality of second nanosheets NW2 and the field insulating layer 105. For example, the second gate spacer 131 is spaced apart from an upper surface of the uppermost nanosheet of the plurality of second nanosheets NW2 in the vertical direction DR3. The second gate spacer 131 includes two spacers spaced apart from each other in the first horizontal direction DR1. The second gate trench GT2 is formed between two spacers of the second gate spacer 131.

Each of the first and second gate spacers 121 and 131 includes, for example, at least one of silicon nitride (SiN), silicon oxynitride (SiON), silicon oxide ($SiO_2$), silicon oxy-carbonitride (SiOCN), silicon boron nitride (SiBN), silicon oxyboronnitride (SiOBN), or silicon oxycarbide (SiOC) or combinations thereof.

The first gate electrode G1 extends in the second horizontal direction DR2 and is disposed on the first etch stop layer 111 and the field insulating layer 105. The first gate electrode G1 is disposed inside the first gate trench GT1. Further, the first gate electrode G1 surrounds the plurality of first nanosheets NW1. For example, at least a portion of the first gate electrode G1 is disposed between the first etch stop layer 111 and the lowermost nanosheet of the plurality of first nanosheets NW1.

The second gate electrode G2 extends in the second horizontal direction DR2 and is disposed on the second etch stop layer 112 and the field insulating layer 105. The second gate electrode G2 is disposed inside the second gate trench GT2. Further, the second gate electrode G2 surrounds the plurality of second nanosheets NW2. For example, the second gate electrode G2 is not disposed between the lowermost nanosheet of the plurality of second nanosheets NW2 and the second etch stop layer 112.

Each of the first and second gate electrodes G1 and G2 includes at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), or vanadium (V), or combinations thereof. However, embodiments of the present disclosure are not necessarily limited thereto. In some embodiments, each of the first and second gate electrodes G1 and G2 includes at least one of a conductive metal oxide, a conductive metal oxynitride, etc., or includes oxidized products of the above-mentioned materials.

The first source/drain region SD1 is disposed on at least one side surface of the first gate electrode G1 and on an upper surface of the first active pattern 101. For example, the first source/drain region SD1 is disposed on both opposing side surfaces of the first gate electrode G1 and on the upper surface of the first active pattern 101. Further, the first source/drain region SD1 are disposed on at least one side surface of the plurality of first nanosheets NW1 and on the first active pattern 101. For example, the first source/drain region SD1 are disposed on both opposing side surfaces of the plurality of first nanosheets NW1 and on the first active pattern 101. The first source/drain region SD1 are disposed on the first etch stop layer 111.

The first source/drain region SD1 is in contact with the first etch stop layer 111. For example, a bottom surface SD1a of the first source/drain region SD1 contacts the first etch stop layer 111. For example, at least a portion of the first source/drain region SD1 extends into the first etch stop layer 111. However, embodiments of the present disclosure are not necessarily limited thereto. In some embodiments, the bottom surface SD1a of the first source/drain region SD1 is coplanar with the uppermost surface of the first etch stop layer 111.

The first source/drain region SD1 is in contact with a sidewall in the first horizontal direction DR1 of the plurality of first nanosheets NW1. For example, at least a portion of the first source/drain region SD1 extends between adjacent first nanosheets NW1 and is recessed toward the first gate electrode G1. Further, at least a portion of the first source/drain region SD1 is disposed between the first etch stop layer 111 and the lowermost first nanosheet NW1 and is recessed toward the first gate electrode G1. However, embodiments of the present disclosure are not necessarily limited thereto.

The second source/drain region SD2 is disposed on at least one side surface of the second gate electrode G2 and on the second active pattern 102. For example, the second source/drain region SD2 is disposed on both opposing side surfaces of the second gate electrode G2 and on the second active pattern 102. Further, the second source/drain region SD2 is disposed on at least one side surface of the plurality of second nanosheets NW2 and on the second active pattern 102. For example, the second source/drain region SD2 is disposed on both opposing side surfaces of the plurality of second nanosheets NW2 and on the second active pattern 102. The second source/drain region SD2 is disposed on the second etch stop layer 112.

The second source/drain region SD2 is in contact with the second etch stop layer 112. For example, a bottom surface SD2a of the second source/drain region SD2 contacts the second etch stop layer 112. For example, at least a portion of the second source/drain region SD2 extends into the second etch stop layer 112. However, embodiments of the present disclosure are not necessarily limited thereto. In some embodiments, the bottom surface SD2a of the second source/drain region SD2 is coplanar with the uppermost surface of the second etch stop layer 112. The second source/drain region SD2 is in contact with a sidewall in the first horizontal direction DR1 of the plurality of second nanosheets NW2.

The first gate insulating layer 122 is disposed along a sidewall and a bottom surface of the first gate trench GT1. For example, the first gate insulating layer 122 is disposed between the first gate electrode G1 and the first gate spacer 121 and inside the first gate trench GT1. The first gate insulating layer 122 is disposed between the first gate electrode G1 and the field insulating layer 105. The first gate insulating layer 122 is disposed between the first gate electrode G1 and the plurality of first nanosheets NW1. The first gate insulating layer 122 is disposed between the first gate electrode G1 and the first etch stop layer 111. The first gate insulating layer 122 is disposed between the first gate electrode G1 and the first active pattern 101. The first gate insulating layer 122 is disposed between the first gate electrode G1 and the first source/drain region SD1.

The second gate insulating layer 132 is disposed along a sidewall and a bottom surface of the second gate trench GT2. For example, the second gate insulating layer 132 is disposed between the second gate electrode G2 and the second gate spacer 131 and inside the second gate trench GT2. The second gate insulating layer 132 is disposed between the second gate electrode G2 and the field insulating layer 105. The second gate insulating layer 132 is disposed between the second gate electrode G2 and the plurality of second nanosheets NW2. The second gate insulating layer 132 is disposed between the second gate electrode G2 and the second etch stop layer 112. The second gate insulating layer 132 is disposed between the second gate electrode G2 and the second active pattern 102. The second gate insulating layer 132 is disposed between the second gate electrode G2 and the second source/drain region SD2. However, the second gate insulating layer 132 is not disposed between the lowermost second nanosheet NW2 and the second etch stop layer 112.

Each of the first and second gate insulating layers 122 and 132 includes at least one of silicon oxide, silicon oxynitride, silicon nitride, or a high dielectric constant (high-k) material that has a higher dielectric constant than silicon oxide. The high dielectric constant material includes at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

A semiconductor device according to some embodiments includes an NC (negative capacitance) FET that uses a negative capacitor. For example, each of the first and second gate insulating layers 122 and 132 includes a ferroelectric material film that has ferroelectric properties and a paraelectric material film that has paraelectric properties.

The ferroelectric material film has a negative capacitance, and the paraelectric material film has a positive capacitance. For example, when two or more capacitors are connected in series to each other, and a capacitance of each of the capacitors has a positive value, a total capacitance is less than capacitance of each individual capacitor. On the contrary, when at least one of the capacitances of two or more series-connected capacitors has a negative value, a total capacitance is positive and greater than an absolute value of each individual capacitance.

When the negative capacitance ferroelectric material film and the positive capacitance paraelectric material film are connected in series to each other, a total capacitance value of the series-connected ferroelectric material film and paraelectric material film increases. Using the increase in the total capacitance value, a transistor that includes the ferroelectric material film has a subthreshold swing (SS) lower than about 60 mV/decade at room temperature.

The ferroelectric material film includes, for example, at least one of hafnium oxide, hafnium zirconium oxide, barium strontium titanium oxide, barium titanium oxide, or lead zirconium titanium oxide. For example, hafnium zirconium oxide is obtained by doping hafnium oxide with zirconium (Zr). For another example, hafnium zirconium oxide is a compound of hafnium (Hf), zirconium (Zr), and oxygen (O).

The ferroelectric material film further contains other dopants. For example, the dopant includes at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) or tin (Sn). A type of the dopant contained in the ferroelectric material film varies depending on a type of the ferroelectric material in the ferroelectric material film.

When the ferroelectric material film includes hafnium oxide, the dopant in the ferroelectric material film includes, for example, at least one of gadolinium (Gd), silicon (Si), zirconium (Zr), aluminum (Al), or yttrium (Y).

When the dopant is aluminum (Al), the ferroelectric material film includes about 3 to about 8 at % (atomic %) of aluminum. For example, a content of the dopant is a content of aluminum based on a sum of hafnium and aluminum.

When the dopant is silicon (Si), the ferroelectric material film includes about 2 to about 10 at % of silicon. When the dopant is yttrium (Y), the ferroelectric material film includes about 2 to about 10 at % yttrium. When the dopant is gadolinium (Gd), the ferroelectric material film includes about 1 to about 7 at % gadolinium. When the dopant is zirconium (Zr), the ferroelectric material film includes about 50 to about 80 at % zirconium.

The paraelectric material film includes, for example, at least one of silicon oxide or a metal oxide that has a high dielectric constant. The metal oxide in the paraelectric material film includes, for example, at least one of hafnium oxide, zirconium oxide or aluminum oxide. However, embodiments of the present disclosure are not necessarily limited thereto.

The ferroelectric material film and the paraelectric material film may include the same material. The ferroelectric material film has ferroelectric properties, but the paraelectric material film does not have ferroelectric properties. For example, when each of the ferroelectric material film and the paraelectric material film includes hafnium oxide, a crystal structure of hafnium oxide in the ferroelectric material film differs from a crystal structure of hafnium oxide in the paraelectric material film.

The ferroelectric material film has a thickness sufficient to exhibit ferroelectric properties. Although the thickness of the ferroelectric material film is, for example, in a range of about 0.5 to about 10 nm, embodiments of the present disclosure are not necessarily limited thereto. Because a critical thickness for exhibiting ferroelectric properties varies based on a type of the ferroelectric material, the thickness of the ferroelectric material film depends on the type of the ferroelectric material.

For example, each of the first and second gate insulating layers 122 and 132 includes one ferroelectric material film. For another example, each of the first and second gate insulating layers 122 and 132 includes a plurality of ferroelectric material films spaced apart from each other. Each of the first and second gate insulating layers 122 and 132 has a stack film structure in which a plurality of ferroelectric material films and a plurality of paraelectric material films are alternately stacked with each other.

The inner spacer 134 is disposed on a sidewall in the first horizontal direction DR1 of the second gate electrode G2 and between adjacent second nanosheets NW2. Further, the inner spacer 134 is disposed on a sidewall in the first horizontal direction DR1 of the second gate electrode G2 and between an upper surface of the uppermost second nanosheet NW2 and the second gate spacer 131. The inner spacer 134 is disposed between the second gate electrode G2 and the second source/drain region SD2. The inner spacer 134 contacts each of the second source/drain region SD2 and the second gate insulating layer 132.

For example, a portion of the second gate electrode G2 disposed on an upper surface of the uppermost second nanosheet NW2 and between the second gate spacers 131 is in contact with a portion of the second gate electrode G2 disposed between the inner spacers 134 and disposed on an upper surface of the uppermost second nanosheet. The inner spacer 134 includes, for example, at least one of silicon nitride (SiN), silicon oxynitride (SiON), silicon oxide (SiO2), silicon oxycarbonitride (SiOCN), silicon boron nitride (SiBN), silicon oxyboron nitride (SiOBN), or silicon oxycarbide (SiOC), or combinations thereof.

The first capping pattern 123 extends in the second horizontal direction DR2 and is disposed on the first gate electrode G1 and the first gate spacer 121. For example, the first capping pattern 123 contacts an upper surface of the first gate spacer 121. However, embodiments of the present disclosure are not necessarily limited thereto. In some embodiments, the first capping pattern 123 is disposed between the first gate spacers 121. For example, an upper surface of the first capping pattern 123 is coplanar with an upper surface of the first gate spacer 121.

The second capping pattern 133 extends in the second horizontal direction DR2 and is disposed on the second gate electrode G2 and the second gate spacer 131. For example, the second capping pattern 133 contacts an upper surface of the second gate spacer 131. However, embodiments of the present disclosure are not necessarily limited thereto. In some embodiments, the second capping pattern 133 is disposed between the second gate spacers 131. For example, an upper surface of the second capping pattern 133 is coplanar with an upper surface of the second gate spacer 131.

Each of the first and second capping patterns 123 and 133 includes, for example, at least one of silicon nitride (SiN), silicon oxynitride (SiON), silicon oxide (SiO2), silicon carbonitride (SiCN), or silicon oxycarbonitride (SiOCN), or combinations thereof.

The first interlayer insulating layer 140 is disposed on the field insulating layer 105. The first interlayer insulating layer 140 surrounds each of the first and second source/drain regions SD1 and SD2. The first interlayer insulating layer 140 surrounds a sidewall of each of the first and second gate spacers 121 and 131. For example, an upper surface of the first interlayer insulating layer 140 is coplanar with an upper surface of each of the first and second capping patterns 123 and 133. However, embodiments of the present disclosure are not necessarily limited thereto.

The first interlayer insulating layer 140 includes, for example, at least one of silicon oxide, silicon nitride, silicon oxycarbide, silicon oxynitride, silicon oxycarbonitride, or a low-k material (low dielectric constant material). The low dielectric constant material includes, for example, at least one of fluorinated tetraethylorthosilicate (FTEOS), hydrogen silsesquioxane (HSQ), bi s-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, embodiments of the present disclosure are not necessarily limited thereto.

The first gate contact CB1 is disposed on the first gate electrode G1. The first gate contact CB1 extends though the first capping pattern 123 in the vertical direction DR3 and is connected to the first gate electrode G1. The second gate contact CB2 is disposed on the second gate electrode G2. The second gate contact CB2 extends though the second capping pattern 133 in the vertical direction DR3 and is connected to the second gate electrode G2.

For example, an upper surface of each of the first and second gate contacts CB1 and CB2 is coplanar with an upper surface of the first interlayer insulating layer 140. However, embodiments of the present disclosure are not necessarily limited thereto. In FIGS. 2 and 3, each of the first and second gate contacts CB1 and CB2 is shown as having a single layer. However, this is for convenience of illustration, and embodiments of the present disclosure are not necessarily limited thereto. For example, in some embodiments, each of the first and second gate contacts CB1 and CB2 has a multiple layers. Each of the first and second gate contacts CB1 and CB2 includes a conductive material.

The third etch stop layer 150 is disposed on an upper surface of each of the first interlayer insulating layer 140 and the first and second capping patterns 123 and 133. The third etch stop layer 150 is conformally formed, for example. Although FIG. 2 and show that the third etch stop layer 150 is formed as a single film, embodiments of the present disclosure are not necessarily limited thereto. In some embodiments, the third etch stop layer 150 is formed as multiple layers. The third etch stop layer 150 includes, for example, at least one of aluminum oxide, aluminum nitride, hafnium oxide, zirconium oxide, silicon oxide, silicon nitride, silicon oxynitride, silicon carbonitride, silicon oxycarbonitride, or a low-k material.

The second interlayer insulating layer 160 is disposed on the third etch stop layer 150. The second interlayer insulating layer 160 includes, for example, at least one of silicon oxide, silicon nitride, silicon oxynitride, or a low-k material.

The first via V1 extends though the second interlayer insulating layer 160 and the third etch stop layer 150 in the vertical direction DR3 and connects to the first gate contact CB1. The second via V2 extends though the second interlayer insulating layer 160 and the third etch stop layer 150 in the vertical direction DR3 and connects to the second gate contact CB2. Although FIGS. 2 and 3 show each of the first and second vias V1 and V2 as formed of a single film, this is for convenience of illustration, and embodiments of the present disclosure are not necessarily limited thereto. For example, in some embodiments, each of the first and second vias V1 and V2 has a multiple layers. Each of the first and second vias V1 and V2 includes a conductive material.

In a semiconductor device according to some embodiments of the present disclosure, each of the nanosheets formed in the PMOS region includes silicon germanium (SiGe), thereby preventing the source/drain region from being etched in a replacement metal gate (RMG) process. Thus, in a semiconductor device according to some embodiments of the present disclosure, the leakage current between the gate electrode and the source/drain region can be reduced.

Further, in a semiconductor device according to some embodiments of the present disclosure, the etch stop layer, which includes an insulating material, is formed under the nanosheet of the PMOS region, thereby preventing the active pattern, which includes silicon (Si), from being etched in the RMG process.

Hereinafter, a method for manufacturing a semiconductor device according to some embodiments of the present disclosure will be described with reference to FIG. 4 to FIG. 18.

FIG. 4 to FIG. 18 illustrate intermediate structures that correspond to steps of a method for manufacturing a semiconductor device according to some embodiments of the present disclosure.

Figure 4:
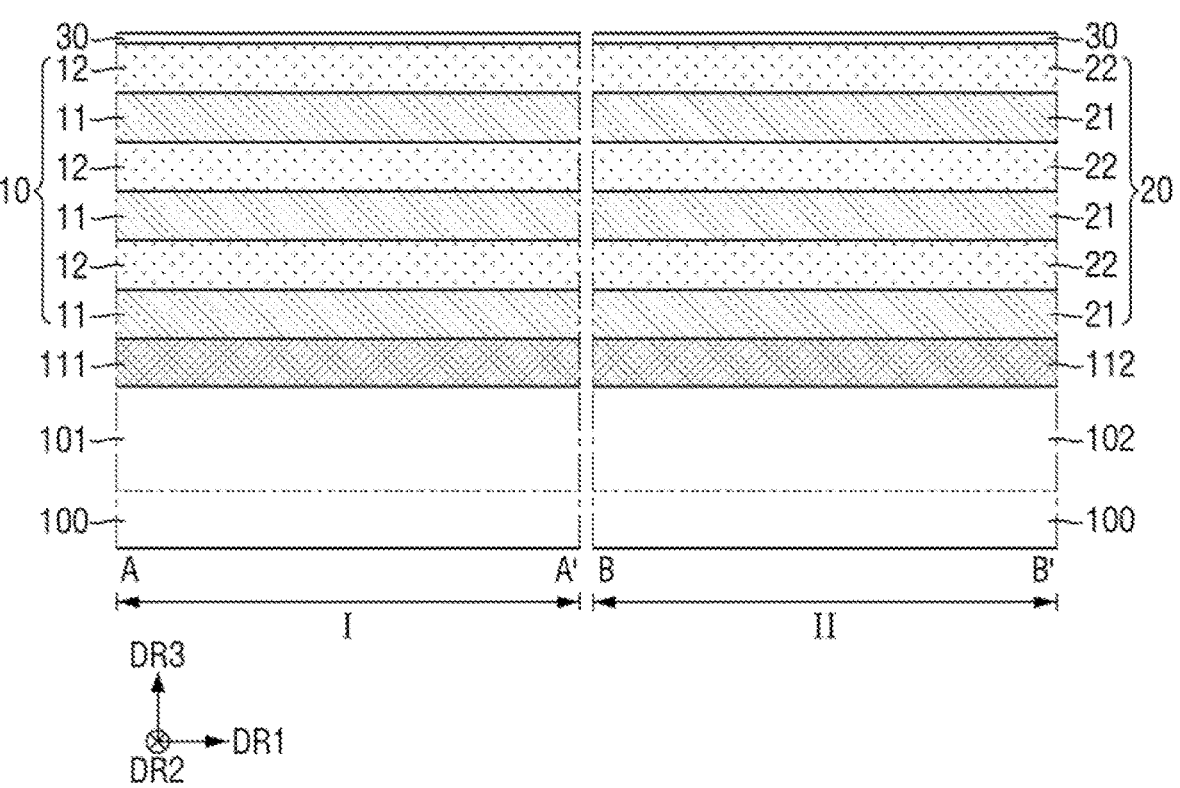
FIG. 4 to FIG. 18 illustrate a method for manufacturing a semiconductor device according to some embodiments of the present disclosure.
Figure 5:
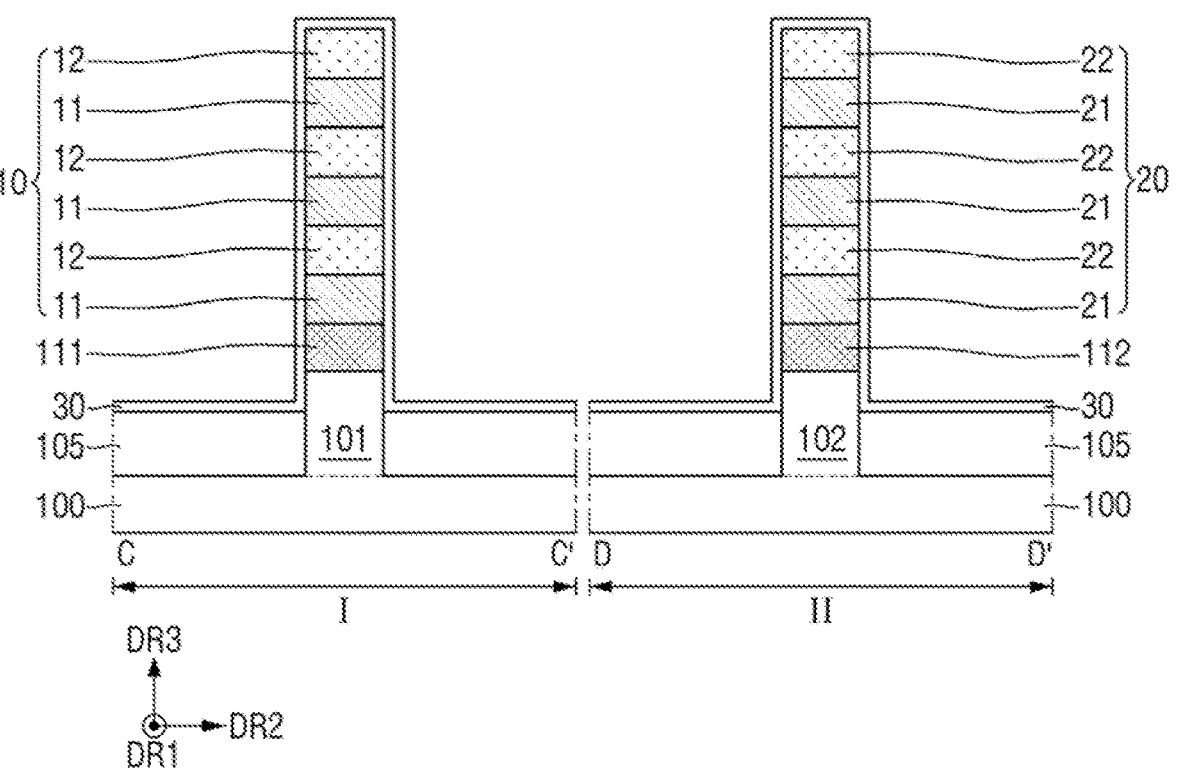

Referring to FIG. 4 and FIG. 5, in an embodiment, the first etch stop layer 111 is formed on the first region I of the substrate 100, and the second etch stop layer 112 is formed on the second region II of the substrate 100. The first etch stop layer 111 and the second etch stop layer 112 are formed using the same manufacturing process.

Subsequently, a first stack structure 10 is formed on the first etch stop layer 111, and a second stack structure 20 is formed on the second etch stop layer 112. The first stack structure 10 and the second stack structure 20 are formed using the same manufacturing process. The first stack structure 10 includes first semiconductor layers 11 and second semiconductor layers 12 that are alternately stacked on top of each other and disposed on the first etch stop layer 111. For example, the first semiconductor layer 11 constitutes the bottommost portion of the first stack structure 10, and the second semiconductor layer 12 constitutes the uppermost portion of the first stack structure 10.

Further, the second stack structure 20 includes third semiconductor layers 21 and fourth semiconductor layers 22 that are alternately stacked on top of each other and disposed on the second etch stop layer 112. For example, the third semiconductor layer 21 constitutes the bottommost portion of the second stack structure 20, and the fourth semiconductor layer 22 constitutes the uppermost portion of the second stack structure 20. The first semiconductor layer 11 and the third semiconductor layer 21 are formed using the same manufacturing process. Further, the second semiconductor layer 12 and the fourth semiconductor layer 22 are formed using the same manufacturing process.

Each of the first semiconductor layer 11 and the third semiconductor layer 21 includes, for example, silicon (Si). Each of the second semiconductor layer 12 and the fourth semiconductor layer 22 includes, for example, silicon germanium (SiGe).

Subsequently, portions of each of the first stack structure 10 and the first etch stop layer 111 are etched. A portion of the substrate 100 is etched while each of the first stack structure 10 and the first etch stop layer 111 is etched. Further, portions of each of the second stack structure 20 and the second etch stop layer 112 are etched. A portion of the substrate 100 is etched while each of the second stack structure 20 and the second etch stop layer 112 is etched. Using this etching process, the first active pattern 101 is formed under the first stack structure 10 and the first etch stop layer 111 and on the first region I of the substrate 100, while the second active pattern 102 is formed under the second stack structure 20 and the second etch stop layer 112 and on the second region II of the substrate 100.

Subsequently, the field insulating layer 105 that surrounds a sidewall of each of the first active pattern 101 and the second active pattern 102 is formed. For example, a vertical level of an upper surface of each of the first active pattern 101 and the second active pattern 102 is higher than that of an upper surface of the field insulating layer 105.

Subsequently, a pad oxide layer 30 is formed that covers an upper surface of the field insulating layer 105, an exposed sidewall of each of the first and second active patterns 101 and 102, an exposed sidewall of each of the first and second etch stop layers 111 and 112, a sidewall and an upper surface of the first stack structure 10, and a sidewall and an upper surface of the second stack structure 20. For example, the pad oxide layer 30 is conformally formed. The pad oxide layer 30 includes, for example, silicon oxide (SiO2).

Figure 6:
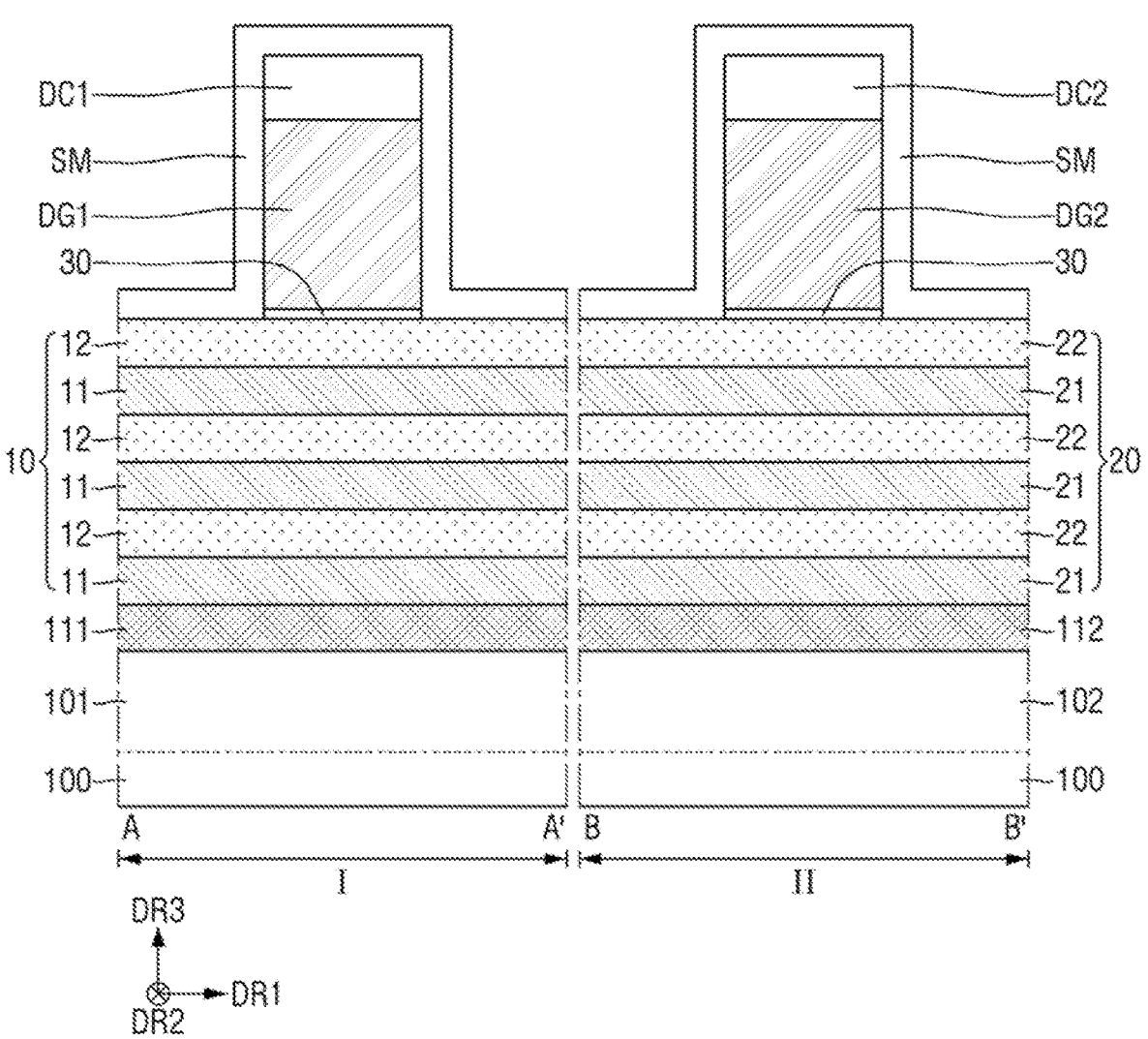
Figure 7:
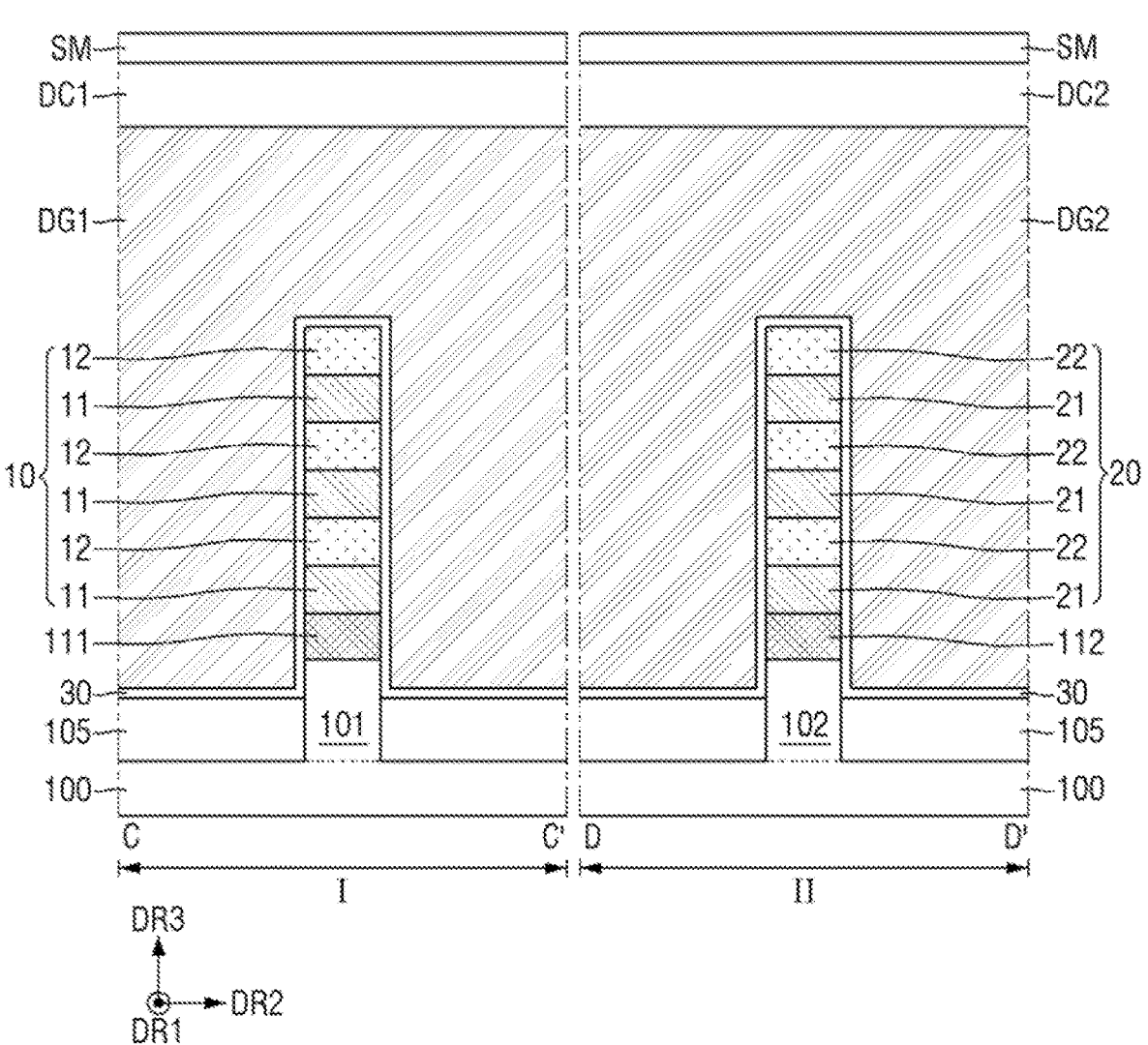

Referring to FIG. 6 and FIG. 7, in an embodiment, a first dummy gate DG1 and a first dummy capping pattern DC1 that extend in the second horizontal direction DR2 on the pad oxide layer 30 are formed on the first stack structure 10 and the field insulating layer 105. The first dummy capping pattern DC1 is formed on the first dummy gate DG1. While the first dummy gate DG1 and the first dummy capping pattern DC1 are being formed, a remaining portion of the pad oxide layer 30, except for a portion that overlaps the first dummy gate DG1 in the vertical direction DR3 on the first region I of the substrate 100, is removed.

Further, a second dummy gate DG2 and a second dummy capping pattern DC2 that extend in the second horizontal direction DR2 on the pad oxide layer 30 are formed on the second stack structure 20 and the field insulating layer 105. The second dummy capping pattern DC2 is formed on the second dummy gate DG2. While the second dummy gate DG2 and the second dummy capping pattern DC2 are being formed, a remaining portion of the pad oxide layer 30, except for a portion that overlaps the second dummy gate DG2 in the vertical direction DR3 on the second region II of the substrate 100, is removed.

Then, a spacer material layer SM is formed that covers a sidewall of each of the first and second dummy gates DG1 and DG2, a sidewall and an upper surface of each of the first and second dummy capping patterns DC1 and DC2, an exposed sidewall and upper surface of the first stack structure 10, and an exposed sidewall and upper surface of the second stack structure 20. In addition, the spacer material layer SM is also formed on an exposed upper surface of the field insulating layer 105. For example, the spacer material layer SM is conformally formed. The spacer material layer SM includes, for example, at least one of silicon nitride (SiN), silicon oxycarbonitride (SiOCN), silicon boron carbonitride (SiBCN), silicon carbonitride (SiCN), or silicon oxynitride (SiON), or combinations thereof.

Figure 8:
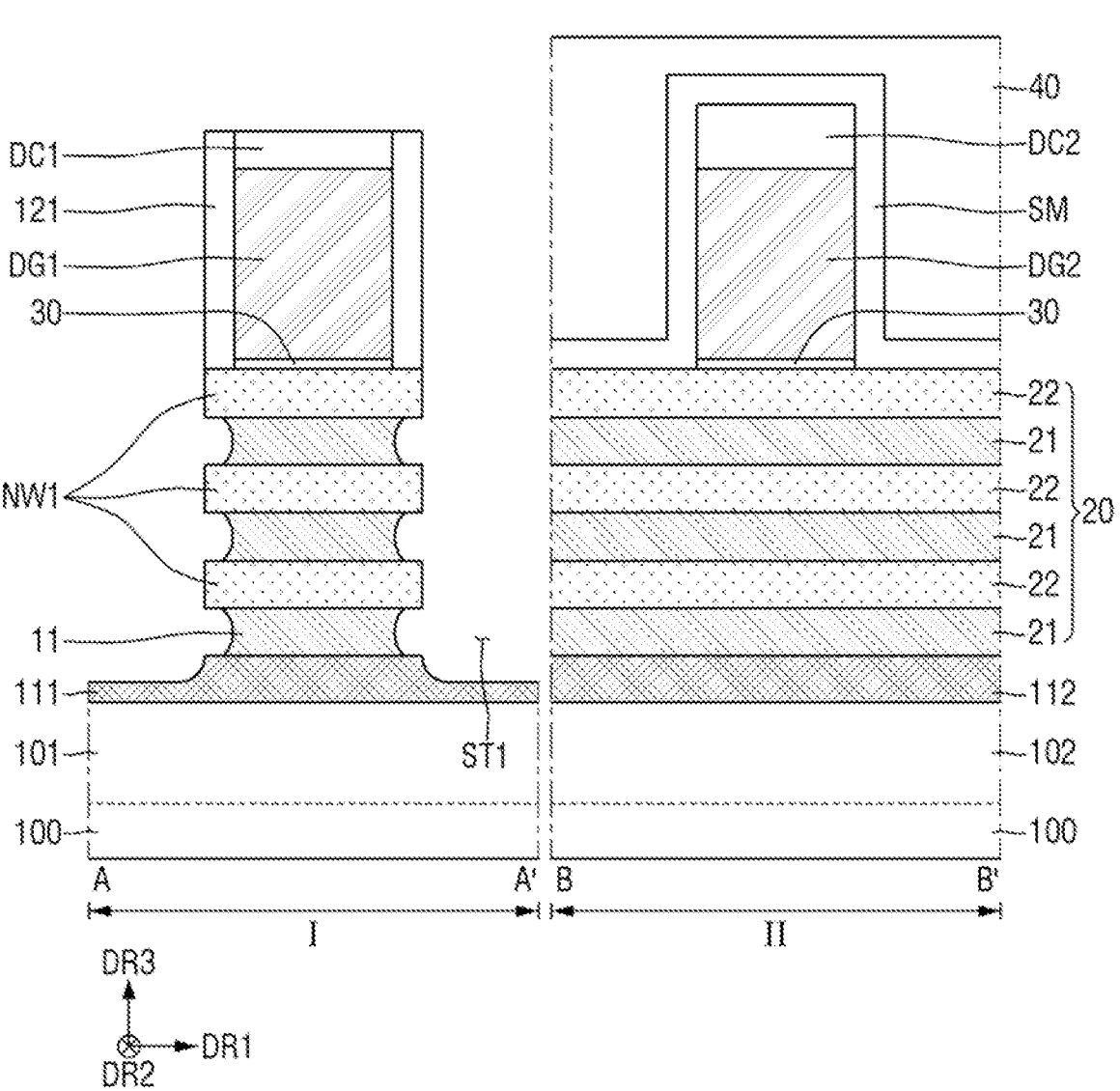

Referring to FIG. 8, in an embodiment, a first protective layer 40 that covers the spacer material layer SM is formed on the second region II of the substrate 100. The first protective layer 40 includes, for example, a spin-on hard mask (SOH). However, embodiments of the present disclosure are not necessarily limited thereto.

Subsequently, the first stack structure (10 in FIG. 6) is etched using the first dummy capping pattern DC1 and the first dummy gate DG1 as a mask to form a first source/drain trench ST1. For example, the first source/drain trench ST1 extends into the first etch stop layer 111.

While the first source/drain trench ST1 is being formed, a portion of a sidewall of the first semiconductor layer 11 is etched. Further, while the first source/drain trench ST1 is being formed, a portion of each of the first dummy capping pattern DC1 and the spacer material layer (SM in FIG. 6) is removed from an upper surface of the first dummy capping pattern DC1. Thus, the spacer material layer that remains on the sidewall of each of the first dummy gate DG1 and the first dummy capping pattern DC1 forms the first gate spacer 121. The second semiconductor layer (12 in FIG. 6) that remains under the first dummy gate DG1 after forming the first source/drain trench ST1 forms the plurality of first nanosheets NW1.

Figure 9:
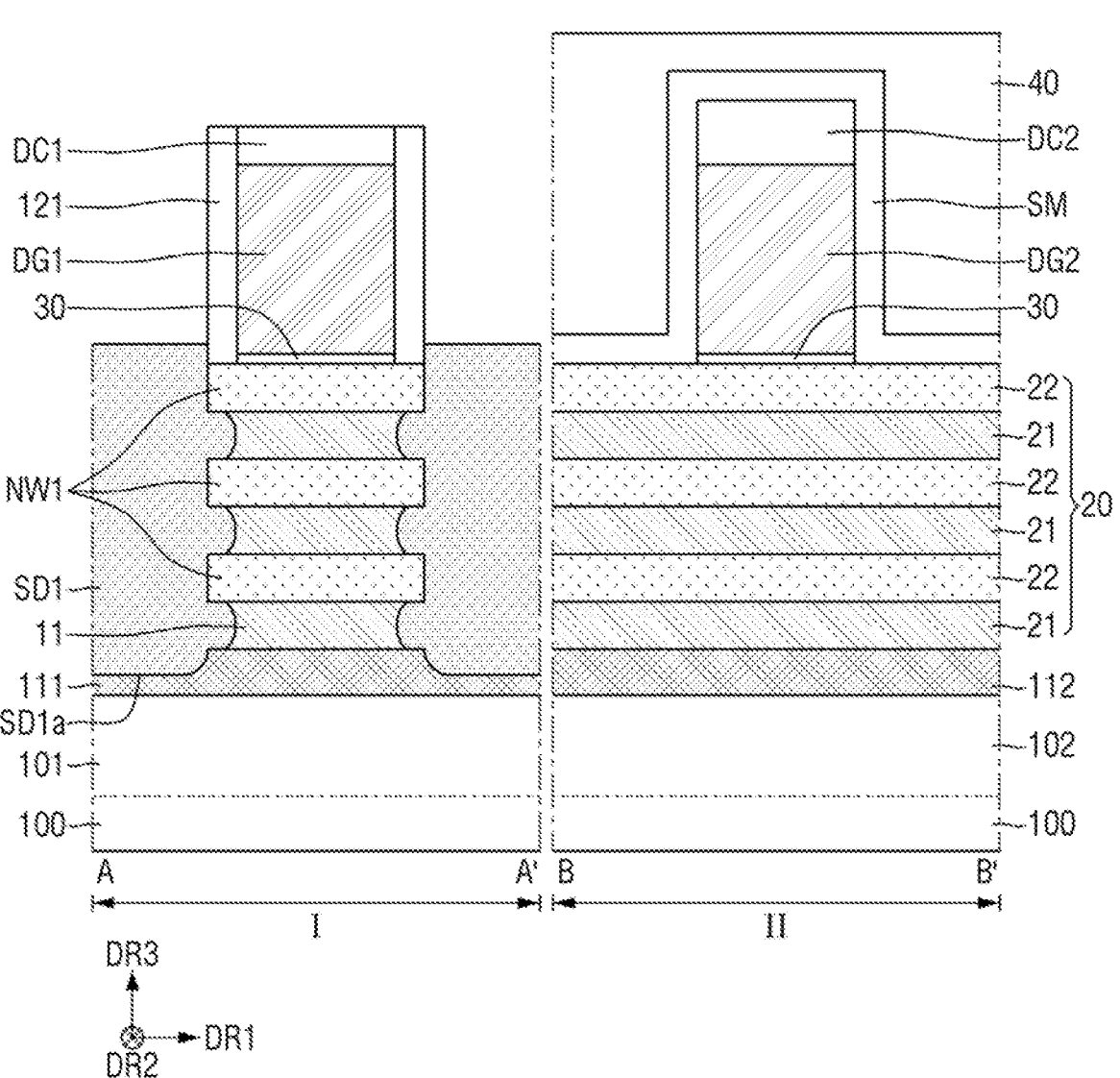

Referring to FIG. 9, in an embodiment, the first source/drain region SD1 is formed inside the first source/drain trench (ST1 in FIG. 8). A bottom surface SD1a of the first source/drain region SD1 contacts the first etch stop layer 111.

Figure 10:
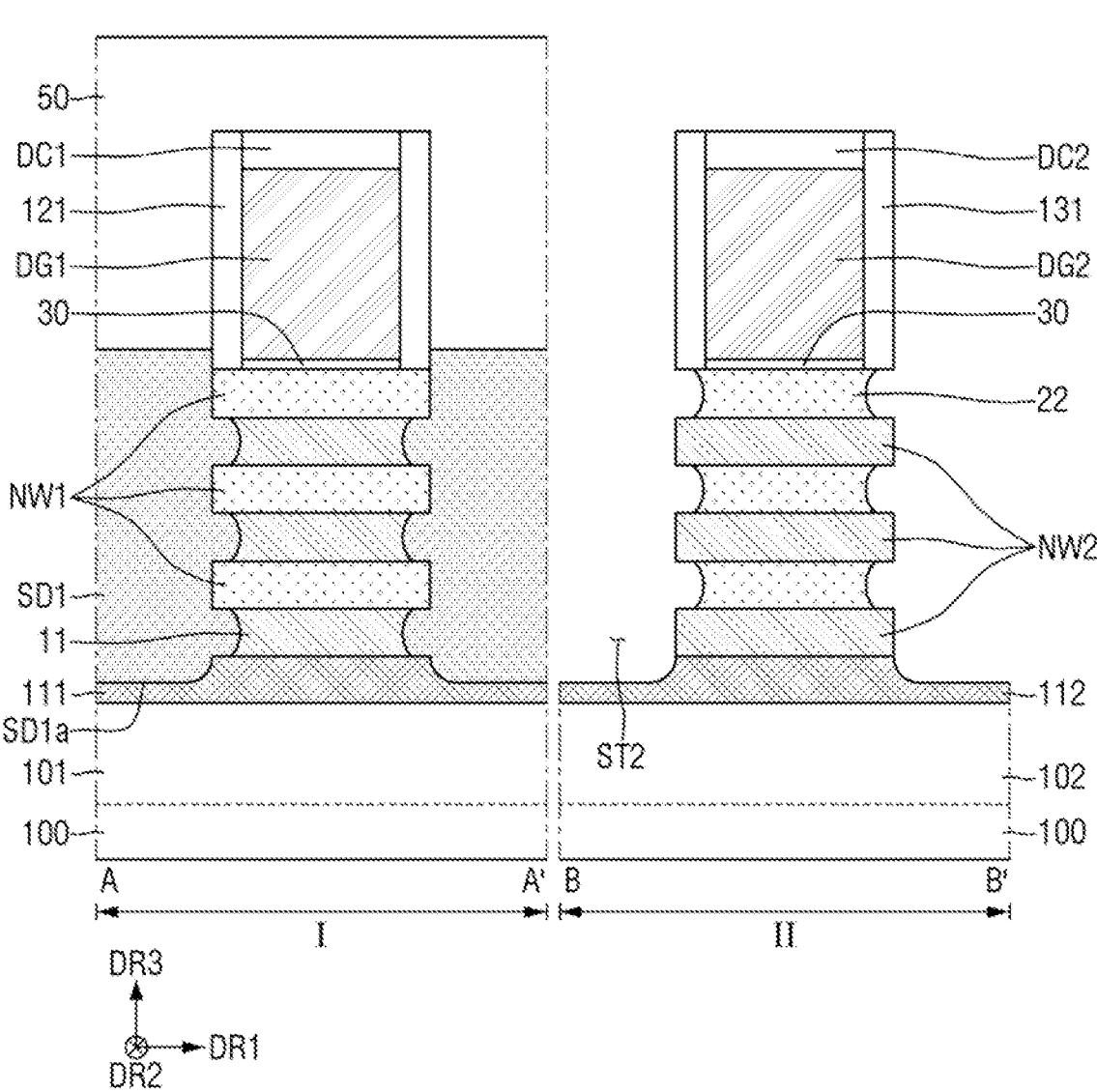

Referring to FIG. 10, in an embodiment, the first protective layer (40 in FIG. 9) is removed, and a second protective layer 50 is formed on the first region I of the substrate 100 and that covers each of an upper surface of the field insulating layer 105, the first source/drain region SD1, the first gate spacer 121 and the first dummy capping patterns DC1. The second protective layer 50 includes, for example, SOH. However, embodiments of the present disclosure are not necessarily limited thereto.

Subsequently, the second stack structure (20 in FIG. 9) is etched using the second dummy capping pattern DC2 and the second dummy gate DG2 as a mask to form a second source/drain trench ST2. For example, the second source/drain trench ST2 extends into the second etch stop layer 112.

While the second source/drain trench ST2 is being formed, a portion of a sidewall of the fourth semiconductor layer 22 is etched. Further, while the second source/drain trench ST2 is being formed, a portion of each of the second dummy capping pattern DC2 and the spacer material layer (SM in FIG. 9) is removed from an upper surface of the second dummy capping pattern DC2. Thus, the spacer material layer that remains on the sidewall of each of the second dummy gate DG2 and the second dummy capping pattern DC2 forms the second gate spacer 131. The third semiconductor layer (21 of FIG. 9) that remains under the second dummy gate DG2 after forming the second source/drain trench ST2 forms the plurality of second nanosheets NW2.

Figure 11:
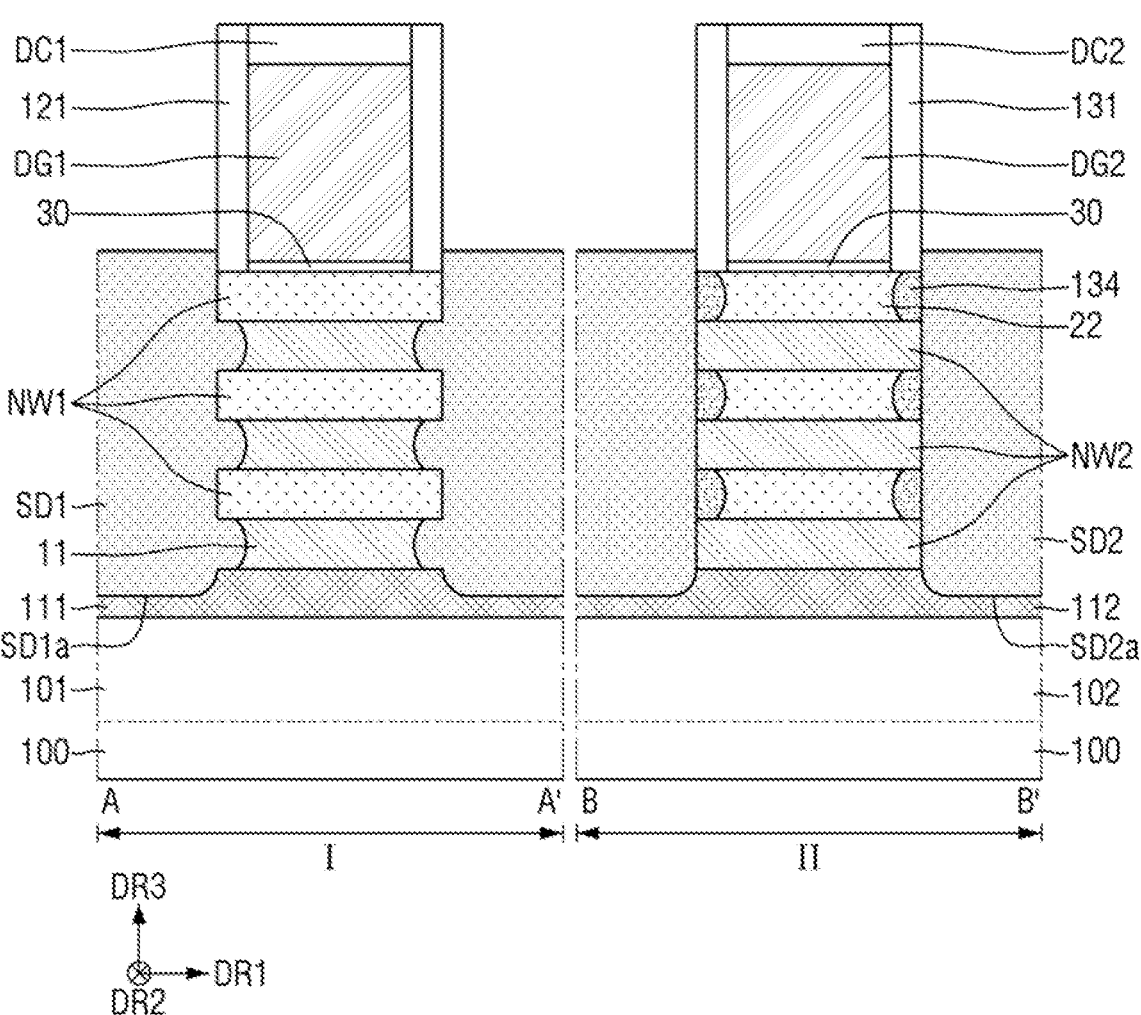

Referring to FIG. 11, in an embodiment, the inner spacer 134 is formed in a space obtained by removing a portion of a sidewall of the fourth semiconductor layer 22. For example, the inner spacer 134 is formed on a sidewall in the first horizontal direction DR1 of the fourth semiconductor layer 22 and between adjacent second nanosheets NW2. Further, the inner spacer 134 is formed on a sidewall in the first horizontal direction DR1 of the fourth semiconductor layer 22 and between an upper surface of the uppermost second nanosheet NW2 and the second gate spacer 131.

Subsequently, the second source/drain region SD2 is formed inside the second source/drain trench (ST2 in FIG. 10). A bottom surface SD2a of the second source/drain region SD2 is in contact with the second etch stop layer 112. Subsequently, the second protective layer (50 in FIG. 10) is removed.

Figure 12:
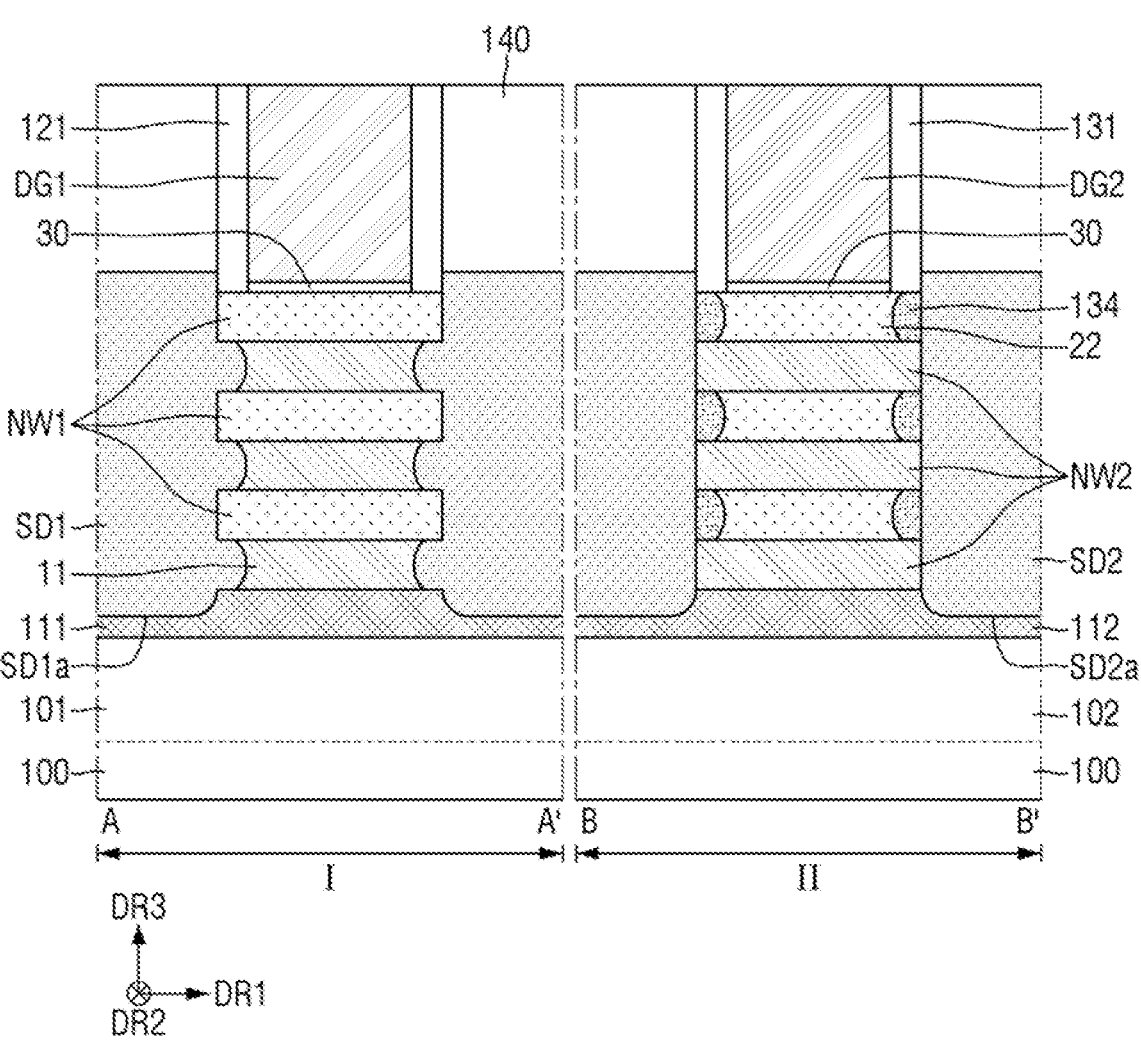

Referring to FIG. 12, in an embodiment, the first interlayer insulating layer 140 is formed that covers each of the first and second source/drain regions SD1 and SD2, the first and second gate spacers 121 and 131 and the first and second dummy capping patterns (DC1 and DC2 of FIG. 11). Subsequently, an upper surface of each of the first and second dummy gates DG1 and DG2 is exposed via a planarization process.

Figure 13:
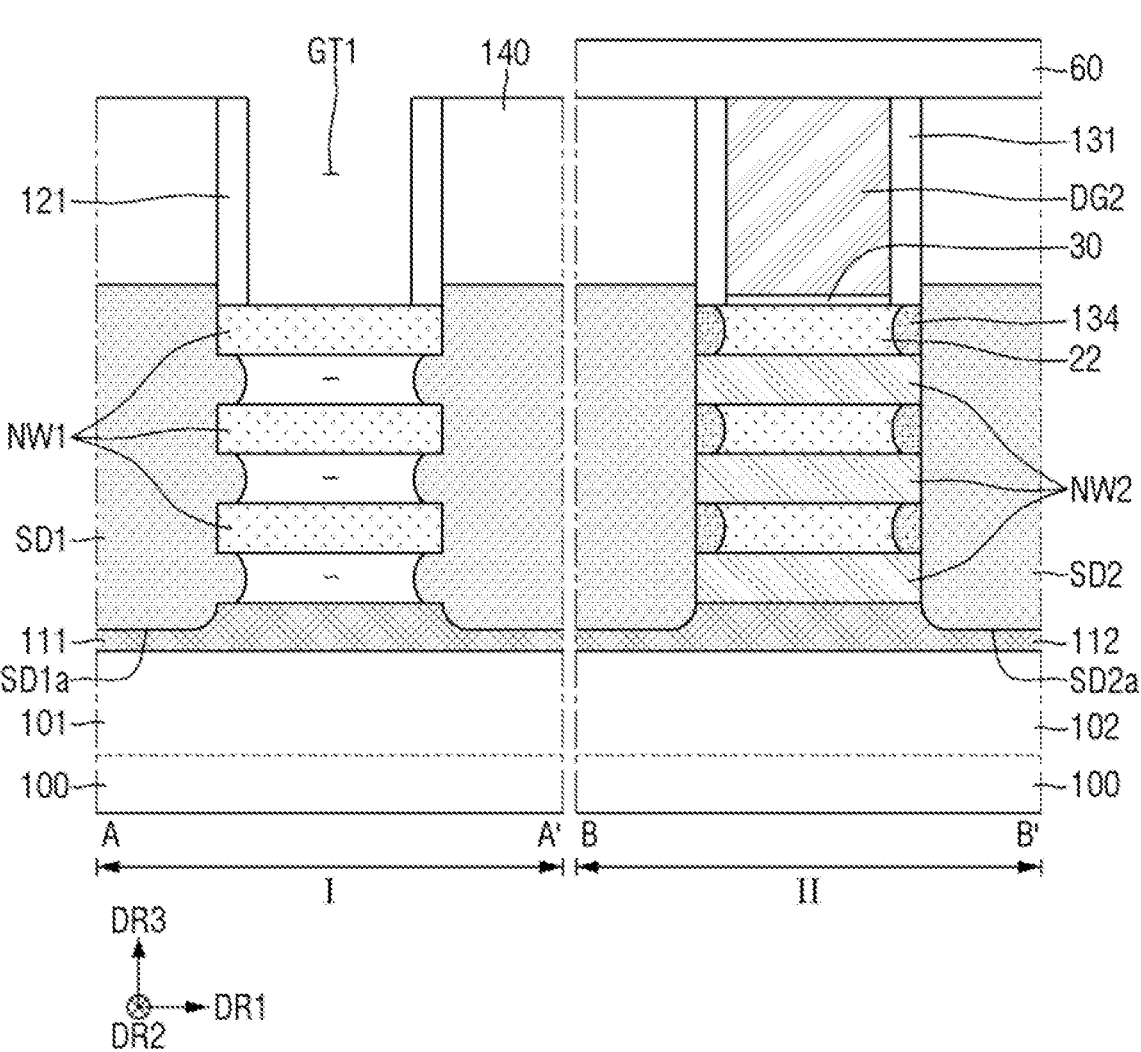
Figure 14:
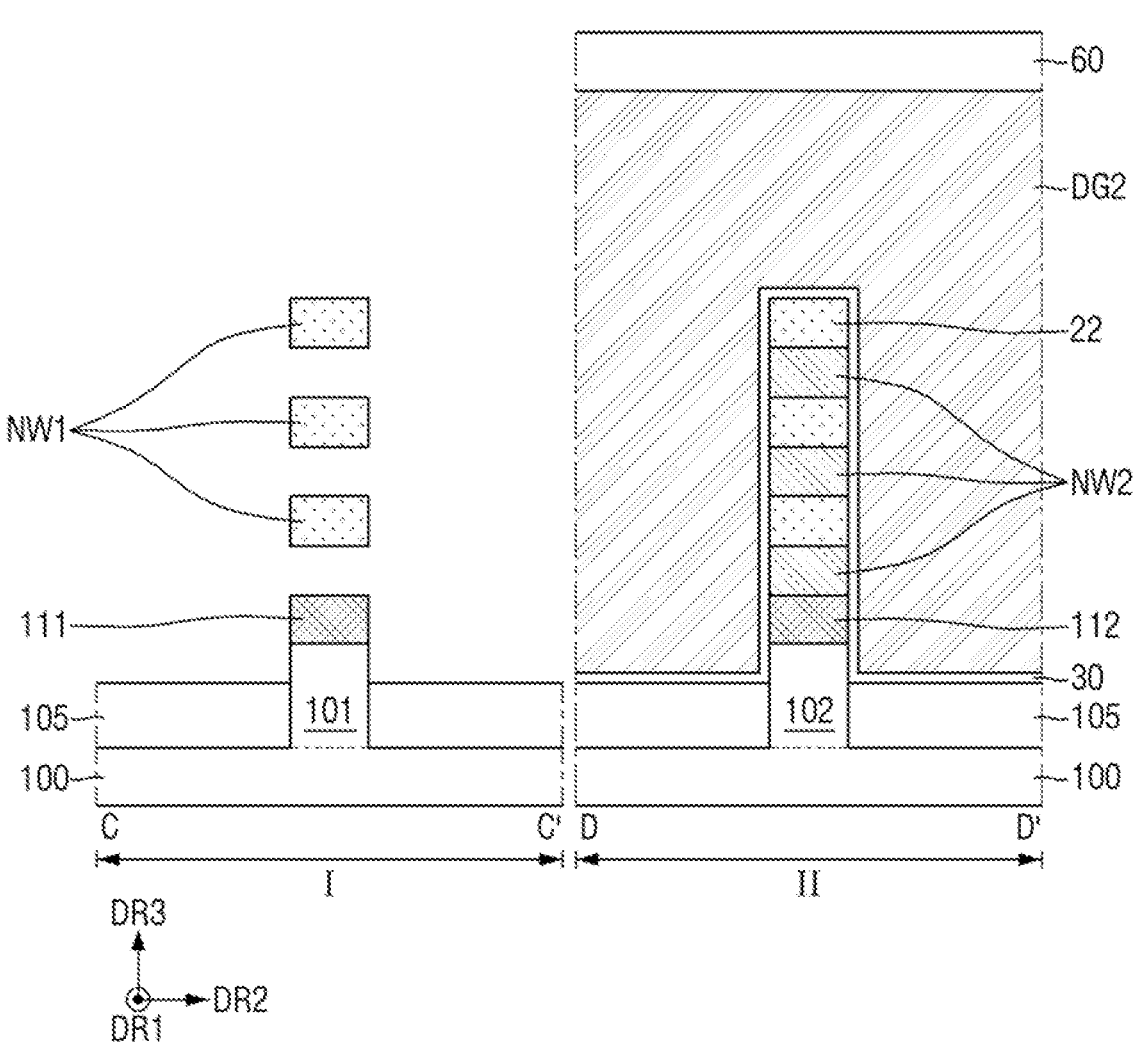

Referring to FIG. 13 and FIG. 14, in an embodiment, a third protective layer 60 is disposed on the second region II of substrate 100 on each of an upper surface of the first interlayer insulating layer 140, an upper surface of the second gate spacer 131, and an upper surface of the second dummy gate DG2. The third protective layer 60 includes, for example, SOH. However, embodiments of the present disclosure are not necessarily limited thereto.

Subsequently, each of the first dummy gate (DG1 in FIG. 12), the pad oxide layer (30 in FIG. 12) and the first semiconductor layer (11 in FIG. 12) are removed in an etching process. During this etching process, the first etch stop layer 111 prevents the first active pattern 101 from being etched. A space obtained by removing the first dummy gate (DG1 in FIG. 12) forms the first gate trench GT1.

Figure 15:
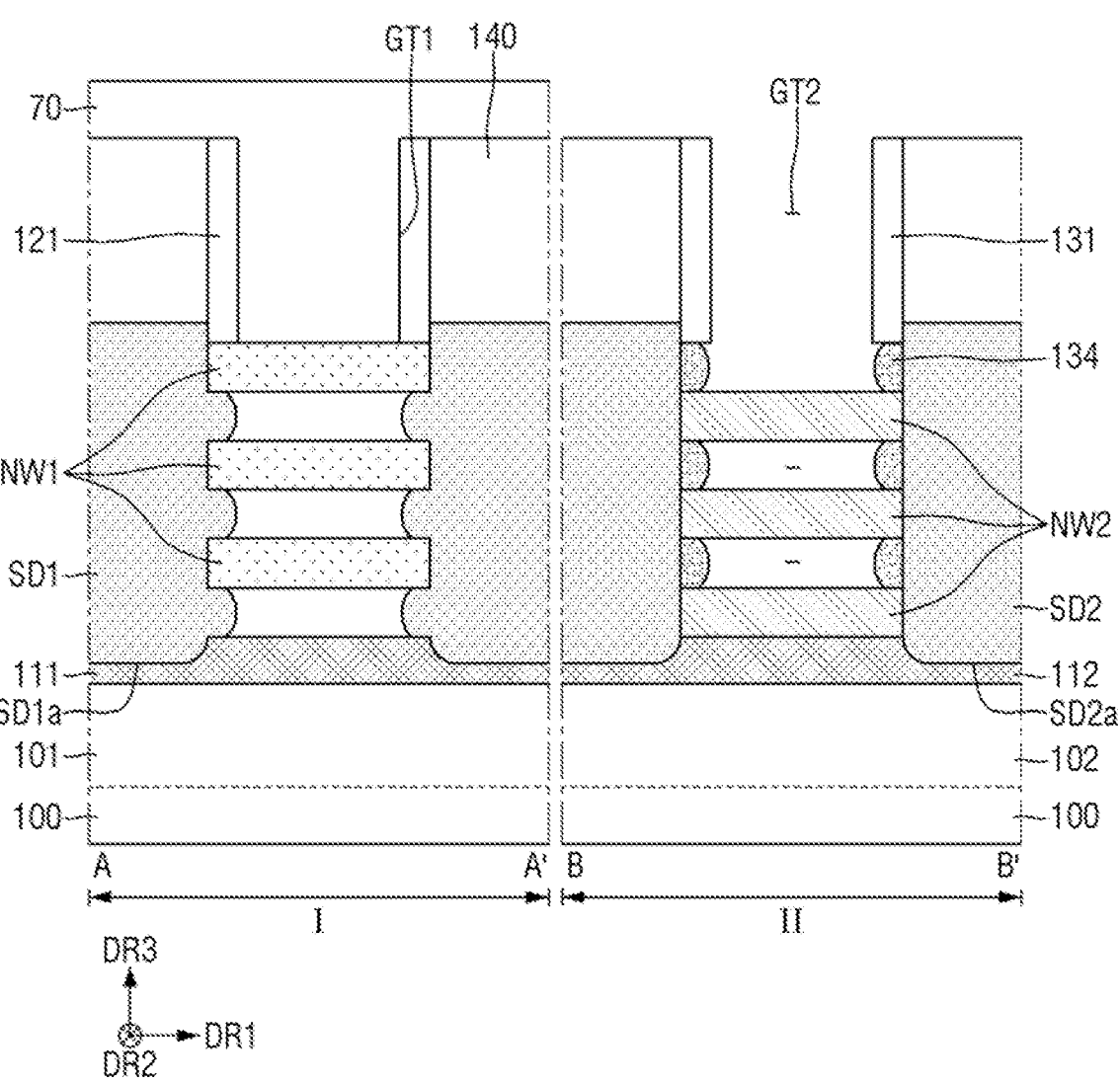
Figure 16:
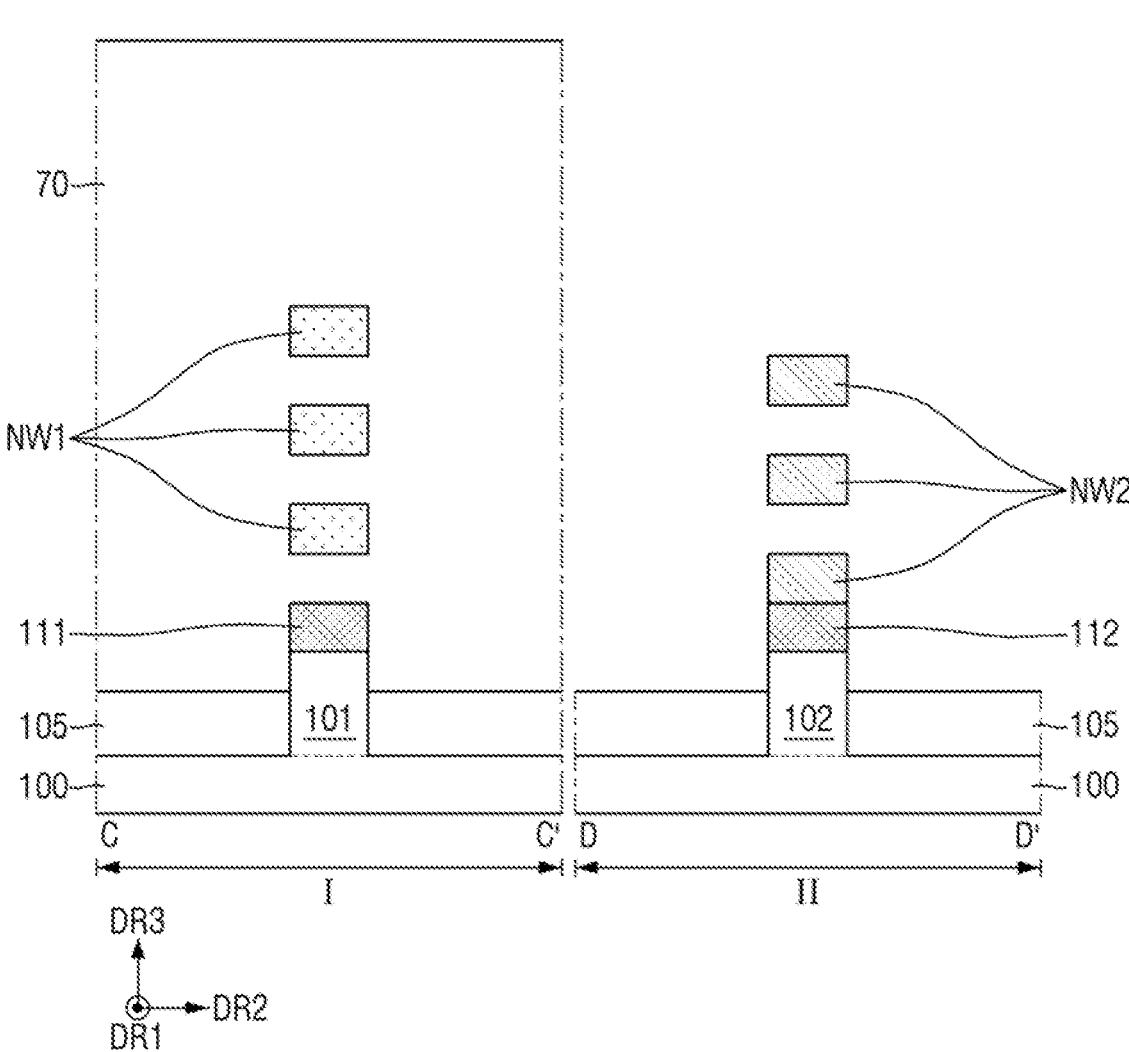

Referring to FIG. 15 and FIG. 16, in an embodiment, the third protective layer (60 in FIGS. 13 and 14) is removed. Then, a fourth protective layer 70 is disposed on the first region I of substrate 100 on an upper surface of the first interlayer insulating layer 140, in the first gate trench GT1, and in a space obtained by removing the first semiconductor layer (11 in FIG. 12). The fourth protective layer 70 includes for example, SOH. However, embodiments of the present disclosure are not necessarily limited thereto.

Subsequently, each of the second dummy gate (DG2 in FIGS. 13 and 14), the pad oxide layer (30 in FIGS. 13 and 14) and the fourth semiconductor layer (22 in FIGS. 13 and 14) are removed in an etching process. During this etching process, the second etch stop layer 112 prevents the second active pattern 102 from being etched. A space obtained by removing the second dummy gate (DG2 in FIGS. 13 and 14) forms the second gate trench GT2.

Figure 17:
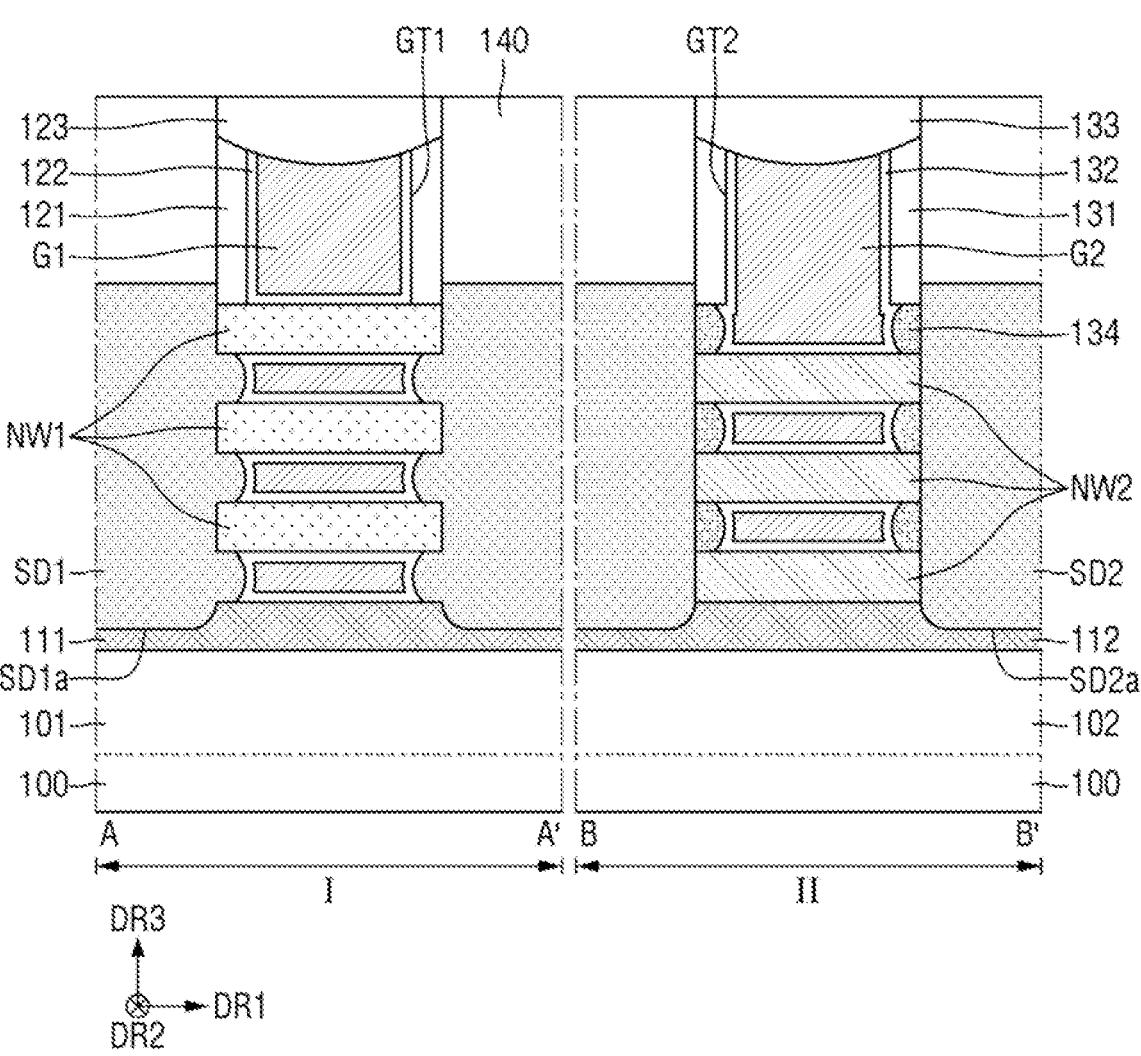
Figure 18:
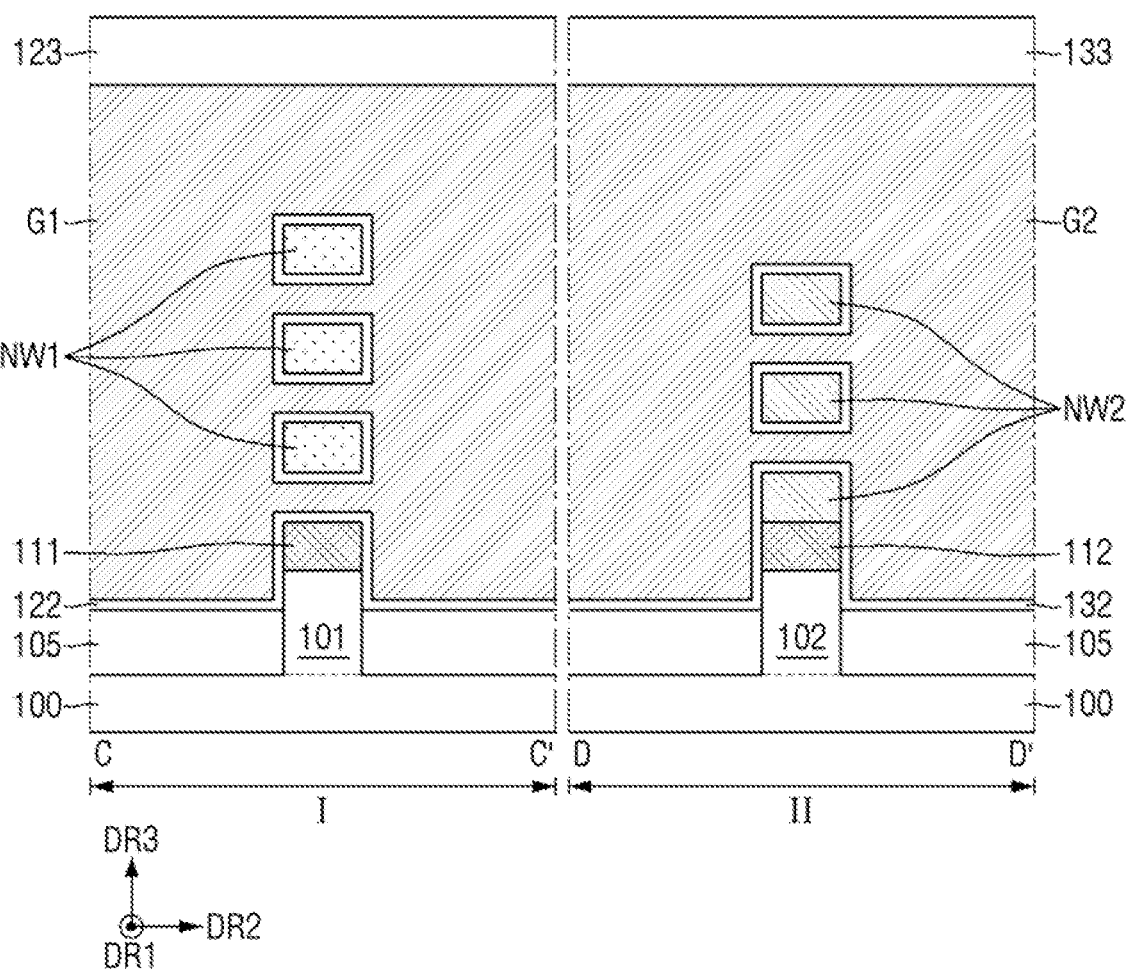

Referring to FIG. 17 and FIG. 18, in an embodiment, the fourth protective layer (70 in FIGS. 15 and 16) is removed. Subsequently, the first gate insulating layer 122 and the first gate electrode G1 are sequentially formed in the first gate trench GT1 and a space obtained by removing the first semiconductor layer (11 of FIG. 12). Further, the second gate insulating layer 132 and the second gate electrode G2 are sequentially formed in the second gate trench GT2 and a space obtained by removing the fourth semiconductor layer (22 of FIGS. 13 and 14).

Subsequently, the first capping pattern 123 is formed on each of the first gate spacer 121, the first gate insulating layer 122 and the first gate electrode G1. Further, the second capping pattern 133 is formed on each of the second gate spacer 131, the second gate insulating layer 132 and the second gate electrode G2. For example, each of an upper surface of the first capping pattern 123 and an upper surface of the second capping pattern 133 is coplanar with an upper surface of the first interlayer insulating layer 140.

Referring to FIG. 2 and FIG. 3, in an embodiment, the first gate contact CB1 that extends through the first capping pattern 123 in the vertical direction DR3 is formed, and thus id connected to the first gate electrode G1. The second gate contact CB2 that extends through the second capping pattern 133 in the vertical direction DR3 is formed, and thus is connected to the second gate electrode G2.

Subsequently, the third etch stop layer 150 and the second interlayer insulating layer 160 are sequentially formed on each of the first interlayer insulating layer 140, the first and second capping patterns 123 and 133, and the first and second gate contacts CB1 and CB2. Subsequently, the first via V1 and the second via V2 that extend through the second interlayer insulating layer 160 and the third etch stop layer 150 in the vertical direction DR3 and are respectively connected to the first gate contact CB1 and the second gate contact CB2 are formed. In this manufacturing process, a semiconductor device shown in FIGS. 2 and 3 is manufactured.

Hereinafter, a semiconductor device according to some embodiments of the present disclosure will be described with reference to FIG. 19. The following descriptions will be based on differences thereof from a semiconductor device as shown in FIGS. 1 to 3.

Figure 19:
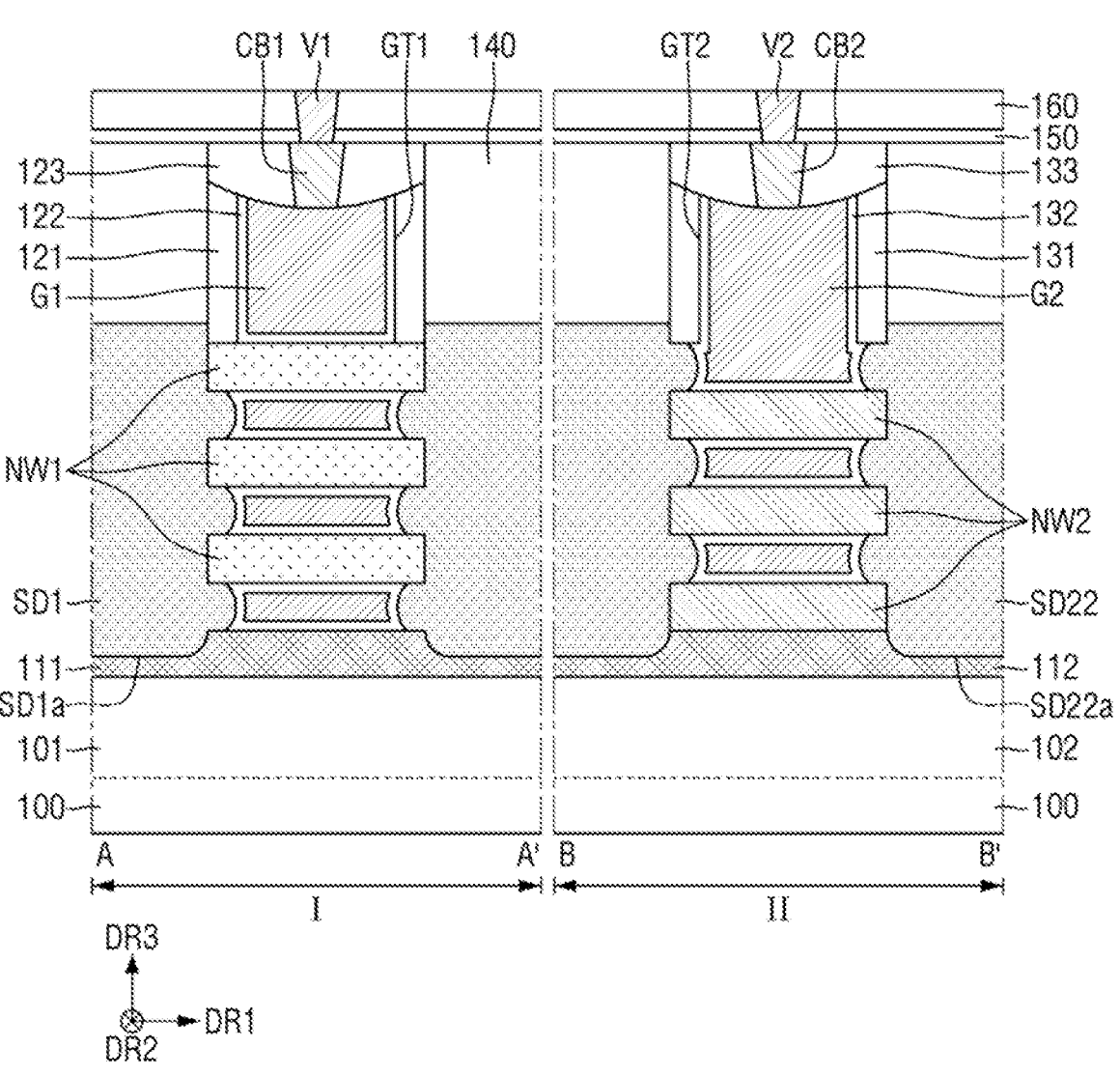
FIG. 19 is a cross-sectional view of a semiconductor device according to some embodiments of the present disclosure.

FIG. 19 is a cross-sectional view of a semiconductor device according to some embodiments of the present disclosure.

Referring to FIG. 19, in a semiconductor device according to some embodiments of the present disclosure, the inner spacer (134 of FIG. 2) is absent.

For example, a portion of a second source/drain region SD22 between adjacent second nanosheets NW2 contacts the second gate insulating layer 132. Further, a portion of the second source/drain region SD22 between an upper surface of the uppermost second nanosheet NW2 and the second gate spacer 131 contacts the second gate insulating layer 132. A bottom surface SD22$a$ of the second source/drain region SD22 is in contact with the second etch stop layer 112.

Hereinafter, a semiconductor device according to some embodiments of the present disclosure will be described with reference to FIG. 20. The following descriptions will be based on differences thereof from the semiconductor device as shown in FIGS. 1 to 3.

Figure 20:
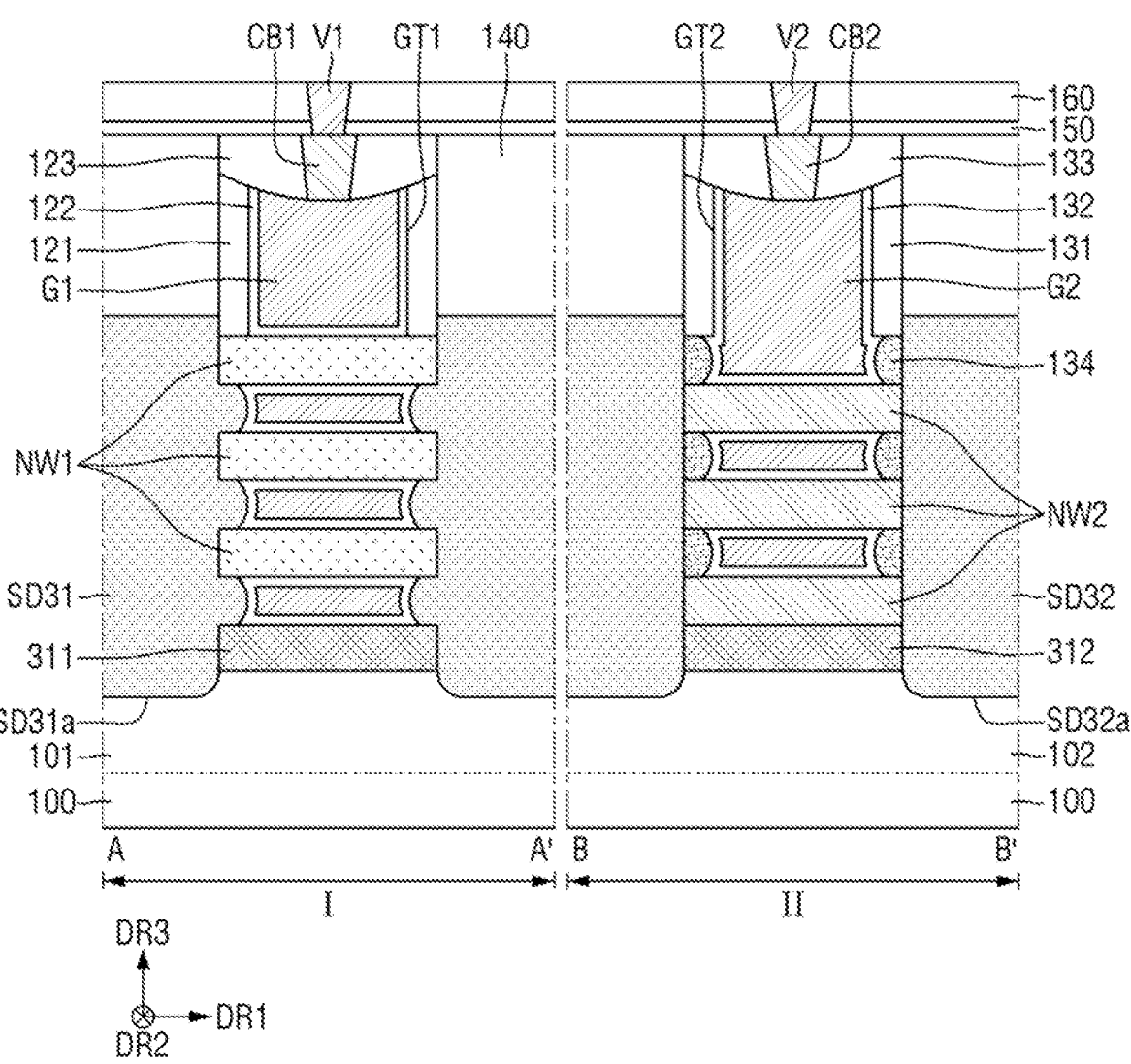
FIG. 20 is a cross-sectional view of a semiconductor device according to some embodiments of the present disclosure.

FIG. 20 is a cross-sectional view of a semiconductor device according to some embodiments of the present disclosure.

Referring to FIG. 20, in a semiconductor device according to some embodiments of the present disclosure, a first source/drain region SD31 is in contact with the first active pattern 101, and a second source/drain region SD32 is in contact with the second active pattern 102.

For example, the first source/drain region SD31 extends through the first etch stop layer 311 in the vertical direction DR3 and into the first active pattern 101. For example, a vertical level of a bottom surface SD31$a$ of the first source/drain region SD31 is lower than that of a bottom surface of the first etch stop layer 311. Further, the second source/drain region SD32 extends through the second etch stop layer 312 in the vertical direction DR3 and into the second active pattern 102. That is, a vertical level of a bottom surface SD32$a$ of the second source/drain region SD32 is lower than that of a bottom surface of the second etch stop layer 312.

Hereinafter, a semiconductor device according to some embodiments of the present disclosure will be described with reference to FIG. 21 and FIG. 22. The following descriptions will be based on differences thereof from the semiconductor device as shown in FIGS. 1 to 3.

Figure 21:
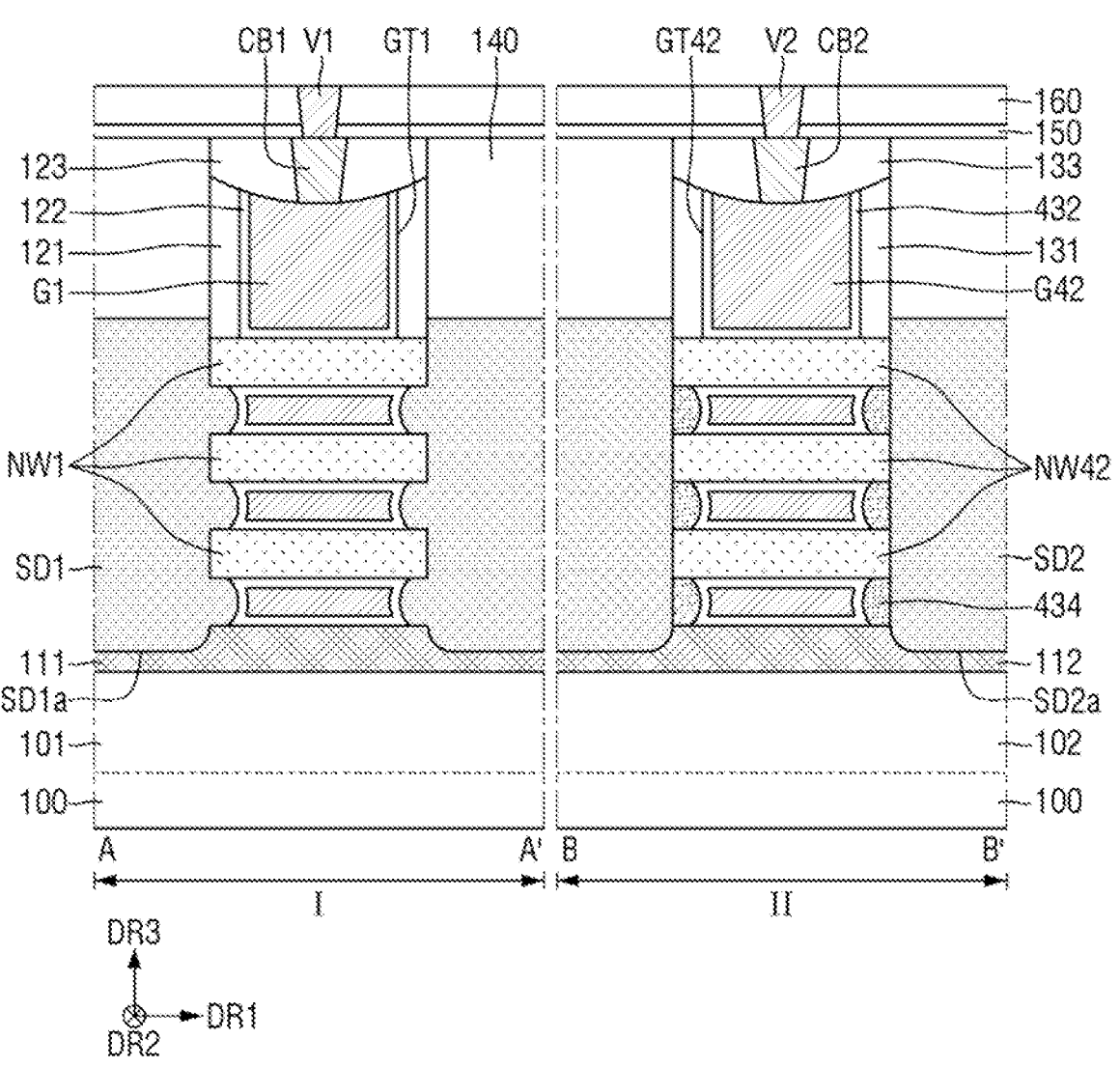
FIG. 21 and FIG. 22 are cross-sectional views of a semiconductor device according to some embodiments of the present disclosure.
Figure 22:
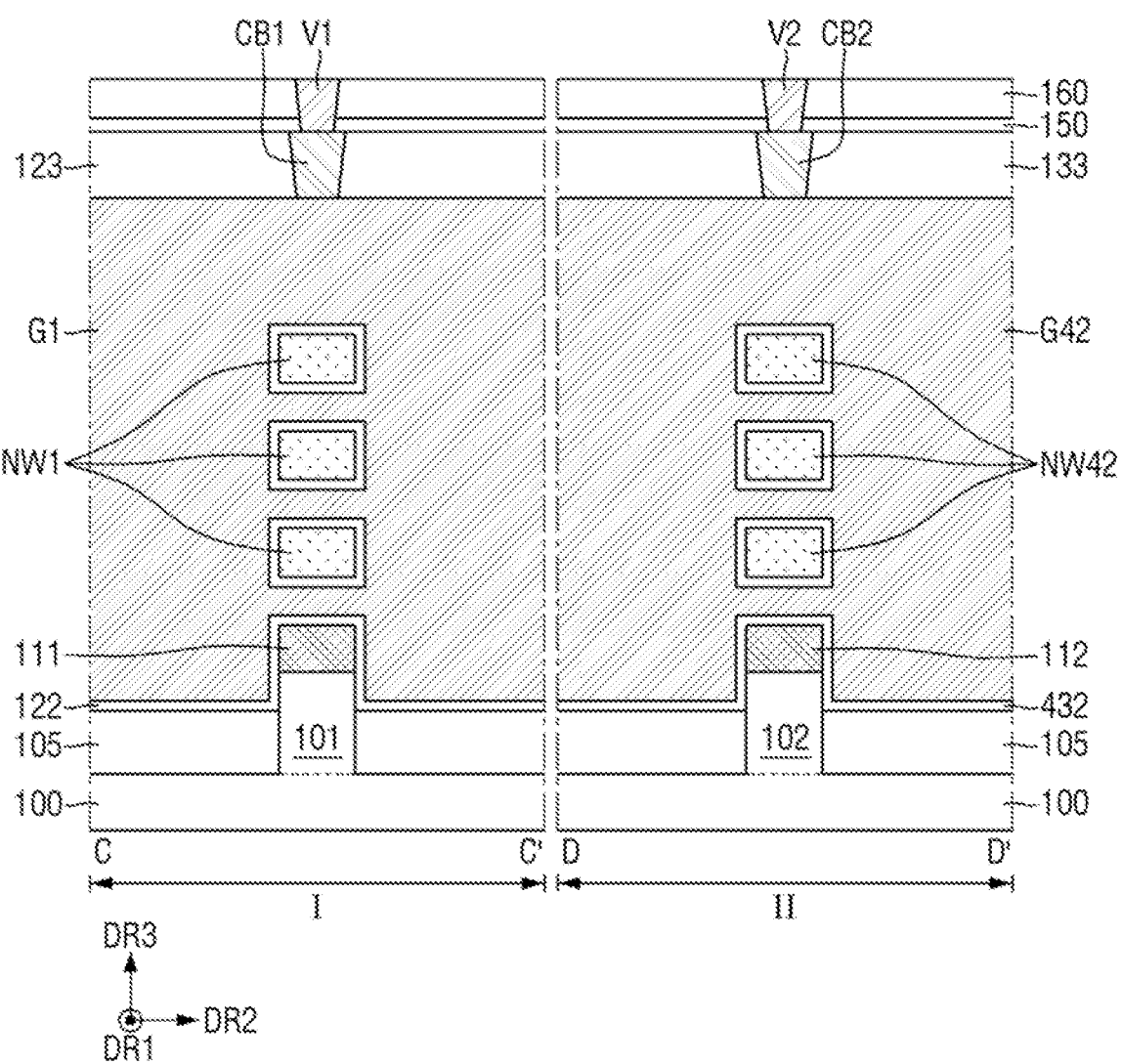

FIG. 21 and FIG. 22 are cross-sectional views of a semiconductor device according to some s embodiments of the present disclosure.

Referring to FIG. 21 and FIG. 22, in a semiconductor device according to some embodiments of the present disclosure, each of a plurality of second nanosheets NW42 disposed on the second region II of the substrate 100 as an NMOS region includes silicon germanium (SiGe).

For example, the plurality of second nanosheets NW42 are disposed at the same vertical levels as the plurality of first nanosheets NW1, respectively. The lowermost second nanosheet NW42 is spaced apart from the second etch stop layer 112 in the vertical direction DR3. The plurality of second nanosheets NW42 include the same material as the plurality of first nanosheets NW1. For example, the plurality of first nanosheets NW1 and the plurality of second nanosheets NW42 include silicon germanium (SiGe).

A second gate trench GT42 is formed on an upper surface of the uppermost second nanosheet NW42 and is defined by the second gate spacer 131. A second gate electrode G42 is disposed inside the second gate trench GT42. The second gate electrode G42 extends in the second horizontal direction DR2 and is disposed on the second etch stop layer 112 and field insulating layer 105. Further, the second gate electrode G42 surrounds the plurality of second nanosheets NW42. For example, the second gate electrode G42 is disposed between the lowermost second nanosheet NW42 and the second etch stop layer 112.

A second gate insulating layer 432 is disposed along a sidewall and a bottom surface of the second gate trench GT42. For example, the second gate insulating layer 432 is disposed between the second gate electrode G42 and the second gate spacer 131 and is received inside the second gate trench GT42. The second gate insulating layer 432 is disposed between the second gate electrode G42 and the field insulating layer 105. The second gate insulating layer 432 is disposed between the second gate electrode G42 and the plurality of second nanosheets NW42. The second gate insulating layer 432 is disposed between the second gate electrode G42 and the second etch stop layer 112. The second gate insulating layer 432 is disposed between the second gate electrode G42 and the second active pattern 102. The second gate insulating layer 432 is disposed between the second gate electrode G42 and the second source/drain region SD2.

An inner spacer 434 is disposed in a space in a sidewall of the third semiconductor layer 21. For example, the inner spacer 434 may be formed on a sidewall in the first horizontal direction DR1 of the third semiconductor layer 21 and between adjacent second nanosheets NW42. Further, the inner spacer 434 is formed on a sidewall in the first horizontal direction DR1 of the third semiconductor layer 21 and between the lowermost second nanosheet NW42 and the second etch stop layer 112.

Hereinafter, a method for manufacturing a semiconductor device as shown in FIG. 21 and FIG. 22 will be described with reference to FIG. 21 to FIG. 28. The following descriptions will be based on differences from a method for manufacturing a semiconductor device as shown in FIG. 4 to FIG. 18.

FIG. 23 to FIG. 28 illustrate intermediate structures that correspond to steps of a method for manufacturing a semiconductor device as shown in FIGS. 21 and 22.

Figure 23:
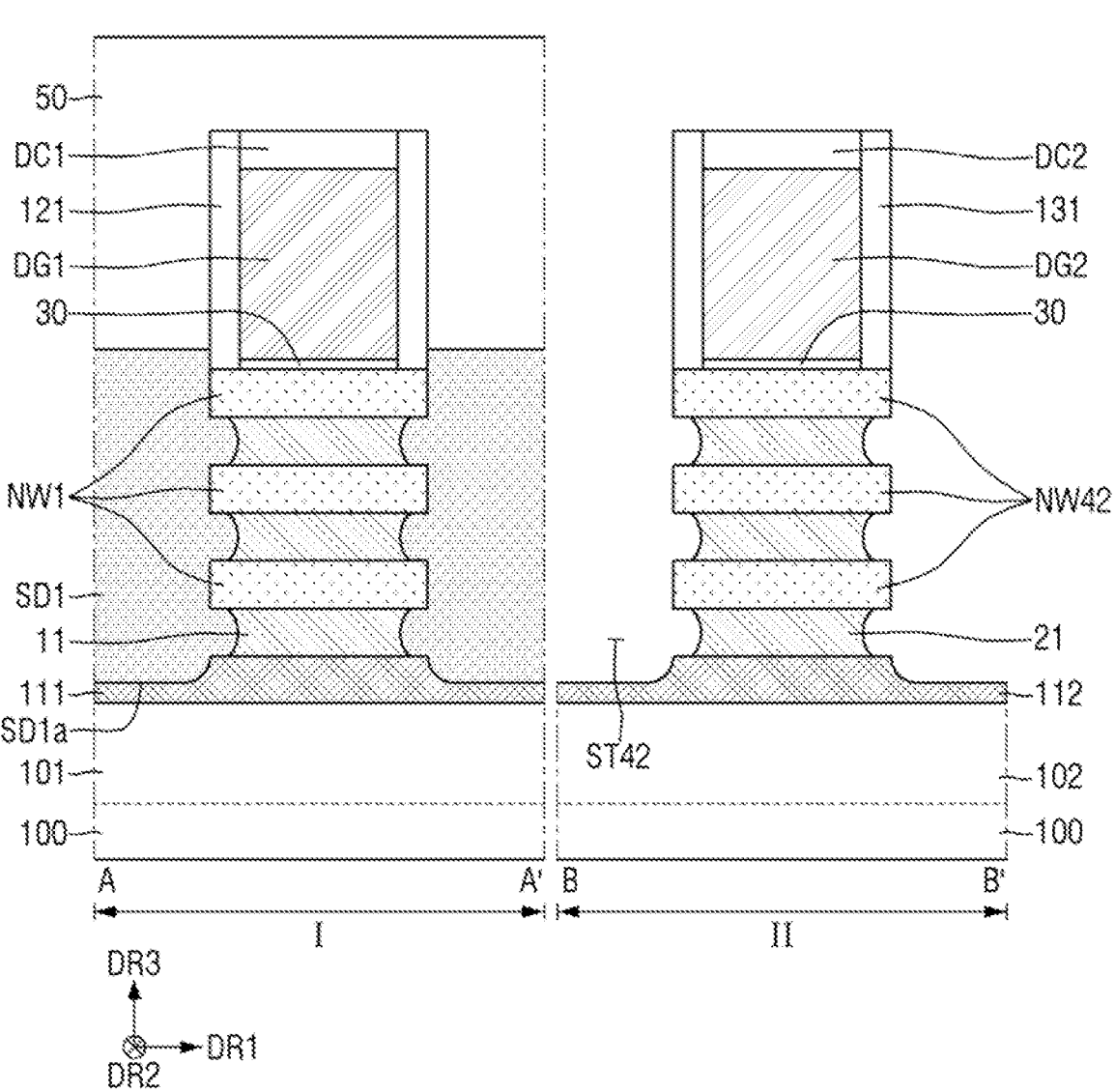
FIG. 23 to FIG. 28 illustrate a method for manufacturing a semiconductor device shown in FIG. 21 and FIG. 22.

Referring to FIG. 23, in an embodiment, a manufacturing process as shown in FIGS. 4 to 9 is performed and then the first protective layer (40 in FIG. 9) is removed. Subsequently, the second protective layer 50 is formed on the first region I of the substrate 100 that covers each of each of an upper surface of the field insulating layer 105, the first source/drain region SD1, the first gate spacer 121 and the first dummy capping pattern DC1.

Subsequently, the second stack structure (20 in FIG. 9) is etched using the second dummy capping pattern DC2 and the second dummy gate DG2 as a mask to form a second source/drain trench ST42. For example, the second source/drain trench ST42 extends into the second etch stop layer 112.

While the second source/drain trench ST42 is being formed, a portion of a sidewall of the third semiconductor layer 21 is also etched. Further, while the second source/drain trench ST42 is being formed, a portion of each of the second dummy capping pattern DC2 and the spacer material layer (SM in FIG. 9) is removed from an upper surface of the second dummy capping pattern DC2. Thus, the spacer material layer that remains on a sidewall of each of the second dummy gate DG2 and the second dummy capping pattern DC2 forms the second gate spacer 131. The fourth semiconductor layer (22 in FIG. 9) that remains under the second dummy gate DG2 after forming the second source/drain trench ST42 forms the plurality of second nanosheets NW42.

Figure 24:
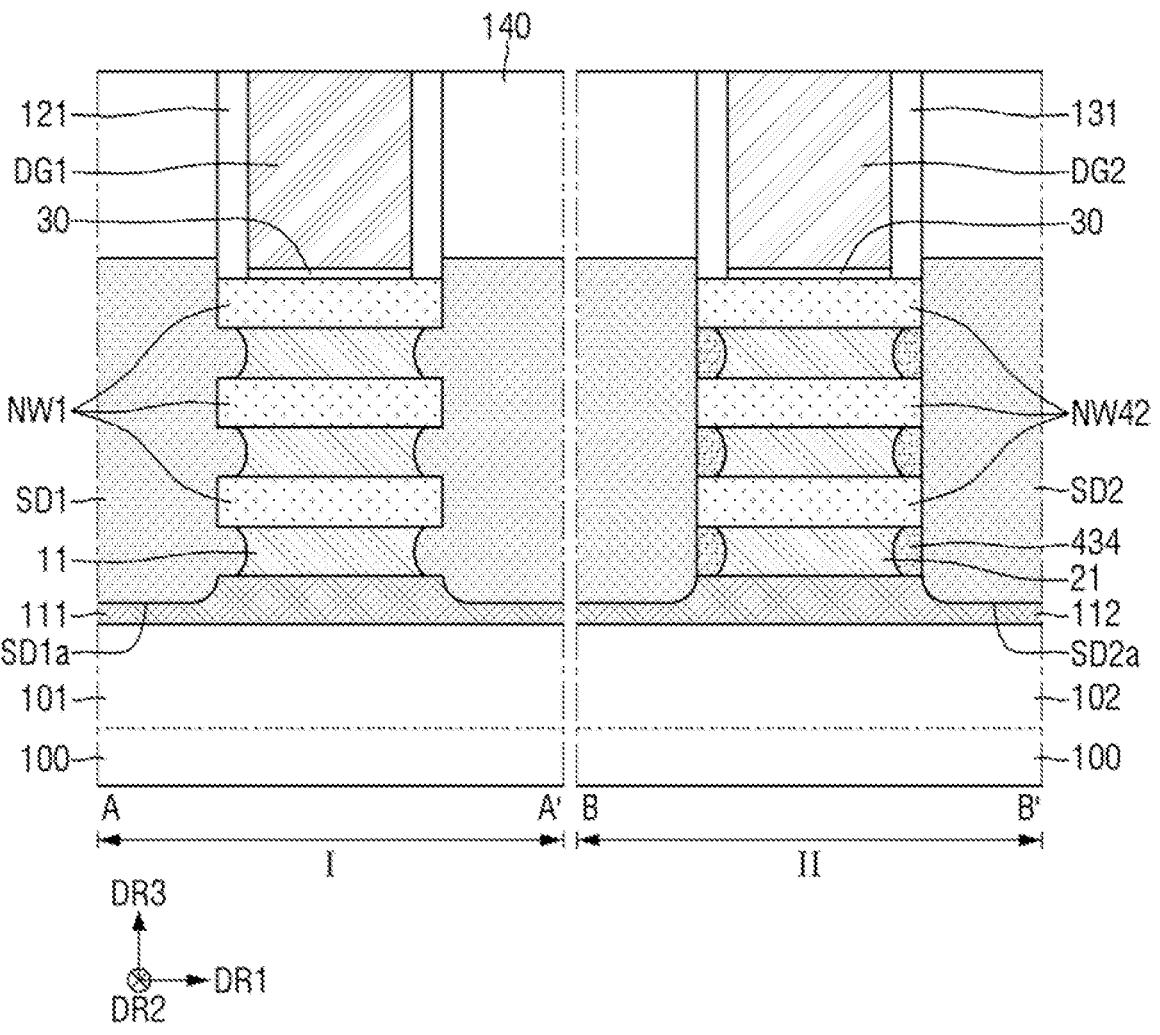

Referring to FIG. 24, in an embodiment, the inner spacer 434 is formed in a space obtained by removing a portion of a sidewall of the third semiconductor layer 21.

Subsequently, the second source/drain region SD2 is formed inside the second source/drain trench (ST42 of FIG. 23). A bottom surface SD2a of the second source/drain region SD2 is in contact with the second etch stop layer 112. Subsequently, the second protective layer (50 in FIG. 23) is removed.

Then, the first interlayer insulating layer 140 is formed that covers each of the first and second source/drain regions SD1 and SD2, the first and second gate spacers 121 and 131 and the first and second dummy capping patterns (DC1 and DC2 of FIG. 23). Subsequently, an upper surface of each of the first and second dummy gates DG1 and DG2 is exposed using a planarization process.

Figure 25:
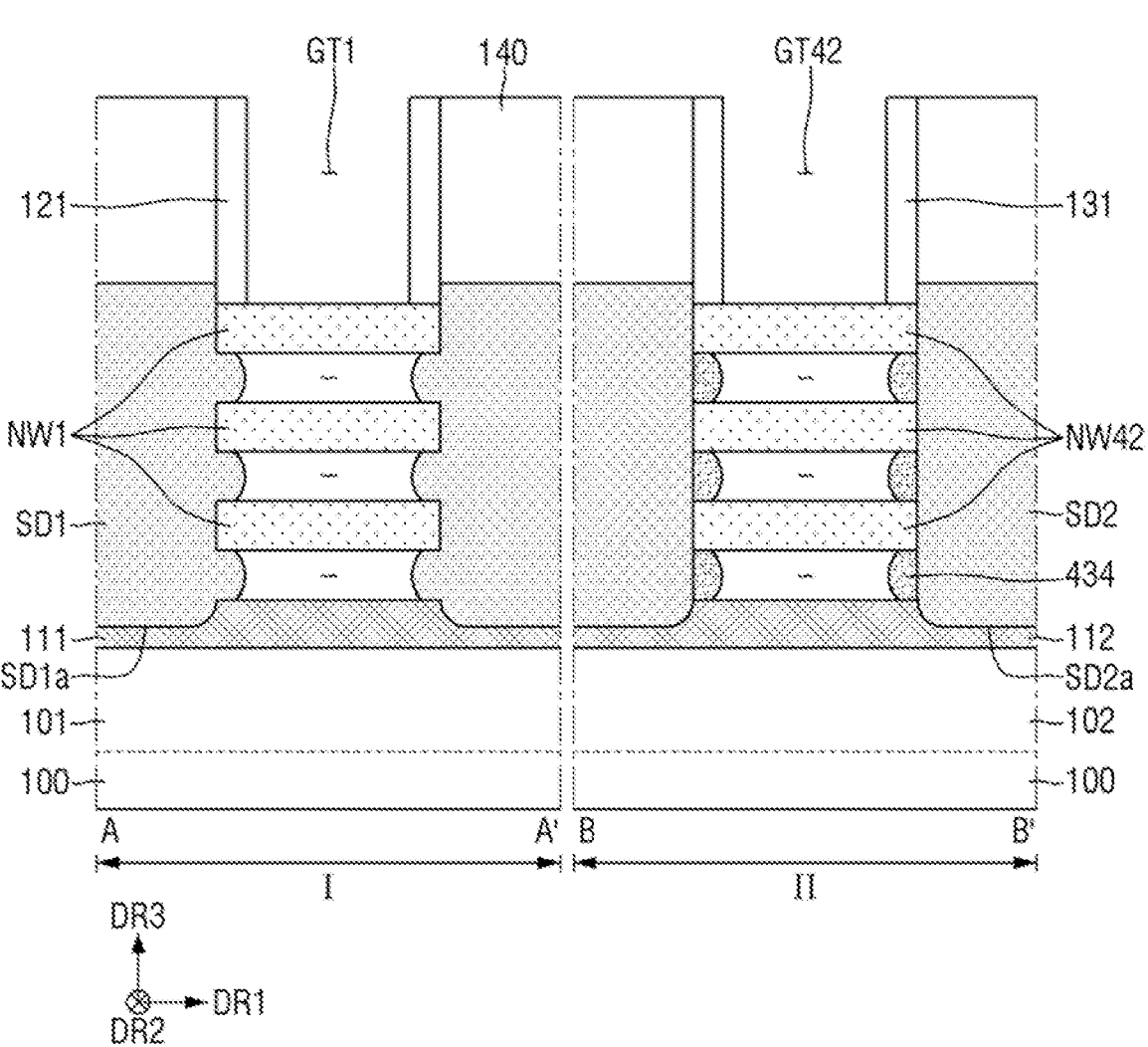
Figure 26:
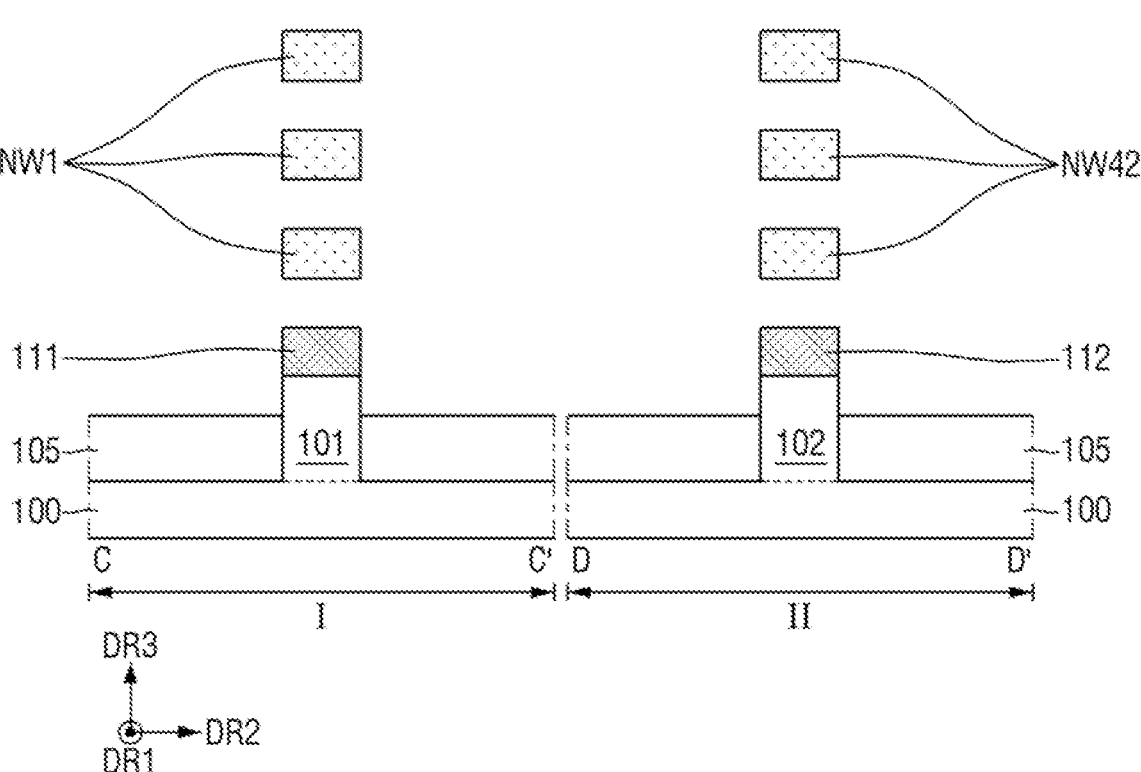

Referring to FIG. 25 and FIG. 26, in an embodiment, each of the first dummy gate (DG1 of FIG. 24), the second dummy gate (DG2 of FIG. 24), the pad oxide layer (30 of FIG. 24), the first semiconductor layer (11 of FIG. 24) and the third semiconductor layer (21 of FIG. 24) are removed in an etching process. During this etching process, the first etch stop layer 111 prevents the first active pattern 101 from being etched, while the second etch stop layer 112 prevents the second active pattern 102 from being etched. A space obtained by removing the first dummy gate forms the first gate trench GT1. Further, a space obtained by removing the second dummy gate forms the second gate trench GT42.

Figure 27:
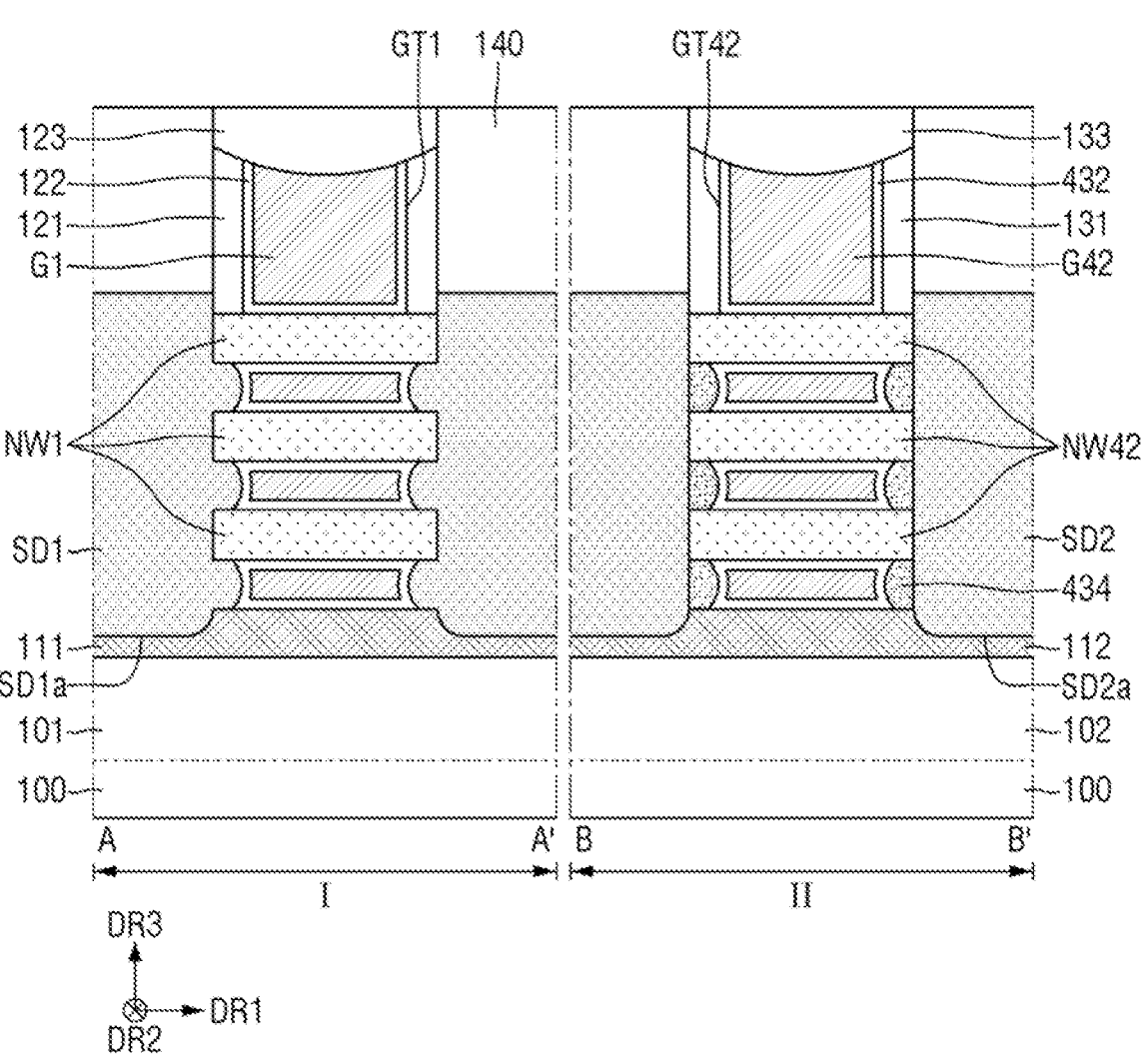
Figure 28:
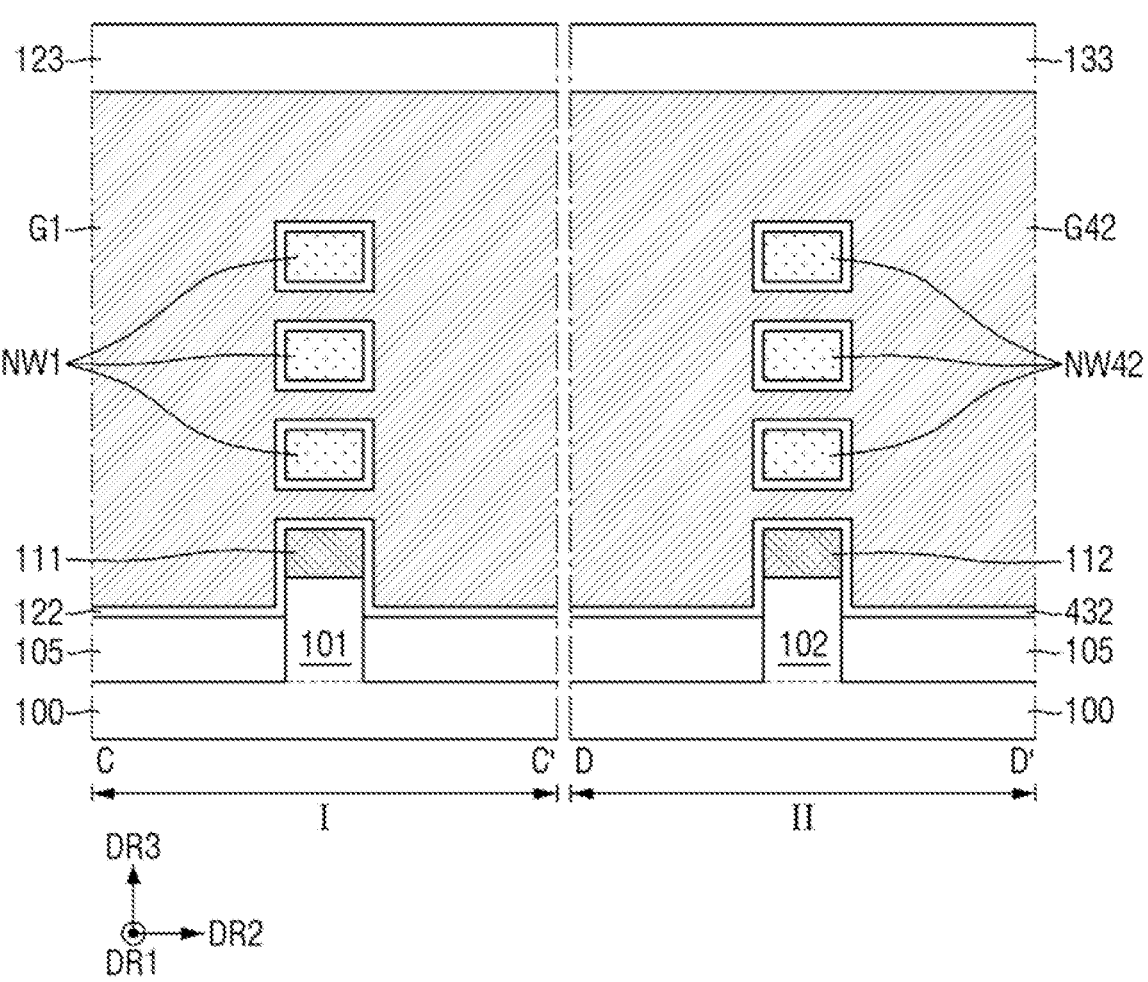

Referring to FIG. 27 and FIG. 28, in an embodiment, the first gate insulating layer 122 and the first gate electrode G1 are sequentially formed in the first gate trench GT1 and in a space obtained by removing the first semiconductor layer (11 of FIG. 24). Further, the second gate insulating layer 432 and the second gate electrode G42 are sequentially formed in the second gate trench GT42 and in a space obtained by removing the third semiconductor layer (21 of FIG. 24).

Subsequently, the first capping pattern 123 is formed on each of the first gate spacer 121, the first gate insulating layer 122 and the first gate electrode G1. Further, the second capping pattern 133 is formed on each of the second gate spacer 131, the second gate insulating layer 432 and the second gate electrode G42.

Referring to FIG. 21 and FIG. 22, the first gate contact CB1 that extends through the first capping pattern 123 in the vertical direction DR3 and connects to the first gate electrode G1 is formed. In addition, the second gate contact CB2 that extends through the second capping pattern 133 in the vertical direction DR3 and connects to the second gate electrode G42 is formed.

Subsequently, the third etch stop layer 150 and the second interlayer insulating layer 160 are sequentially formed on each of the first interlayer insulating layer 140, the first and second capping patterns 123 and 133, and the first and second gate contacts CB1 and CB2. Subsequently, the first via V1 and the second via V2 that extend through the second interlayer insulating layer 160 and the third etch stop layer 150 in the vertical direction DR3 respectively connect to the first gate contact CB1 and the second gate contact CB2 are formed. In this manufacturing process, a semiconductor device as shown in FIGS. 21 and 22 can be manufactured.

Hereinafter, a semiconductor device according to some embodiments of the present disclosure will be described with reference to FIG. 29. The following descriptions will be based on differences from a semiconductor device as shown in FIGS. 21 and 22.

Figure 29:
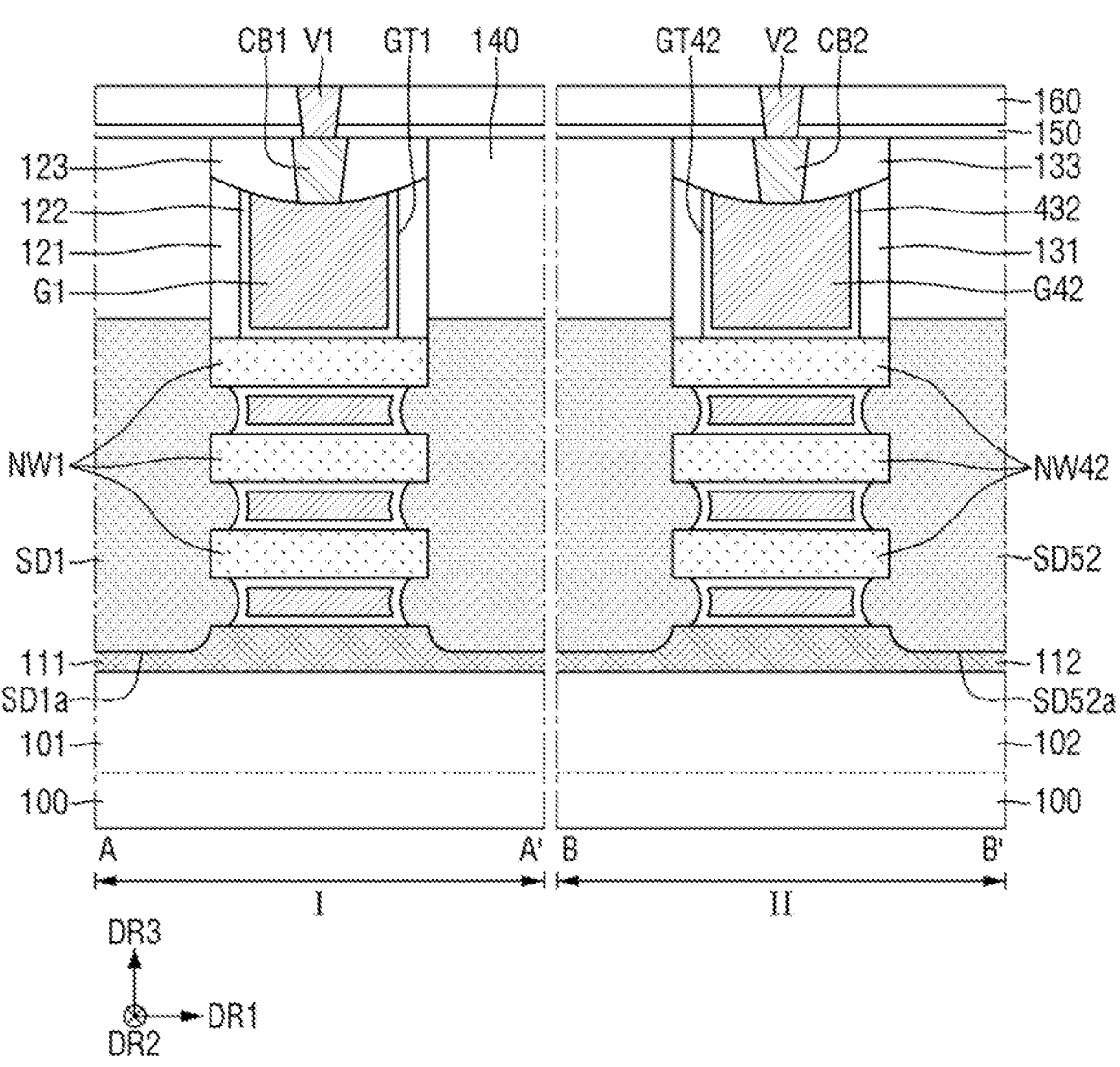
FIG. 29 is a cross-sectional view of a semiconductor device according to some embodiments of the present disclosure.

FIG. 29 is a cross-sectional view of a semiconductor device according to some embodiments of the present disclosure.

Referring to FIG. 29, in a semiconductor device according to some embodiments of the present disclosure, the inner spacer (434 of FIG. 21) is absent.

For example, a portion of a second source/drain region SD52 between adjacent second nanosheets NW42 contacts the second gate insulating layer 432. Further, a portion of the second source/drain region SD52 between the lowermost second nanosheet NW2 and the second etch stop layer 112 contacts the second gate insulating layer 432. A bottom surface SD52*a* of the second source/drain region SD52 may be in contact with the second etch stop layer 112.

Hereinafter, a semiconductor device according to some embodiments of the present disclosure will be described with reference to FIG. 30. The following descriptions will be based on differences from a semiconductor device as shown in FIGS. 21 and 22.

Figure 30:
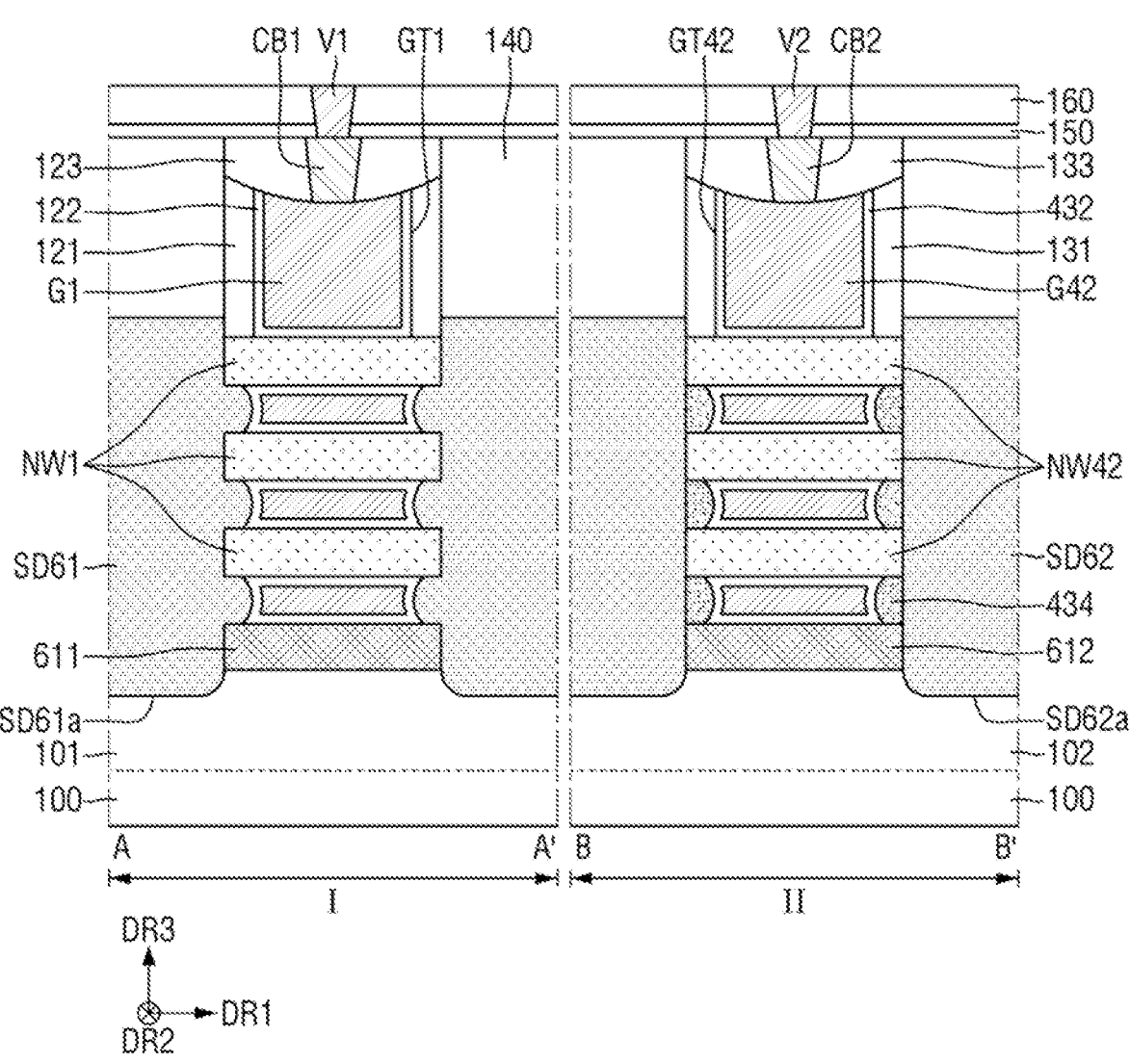
FIG. 30 is a cross-sectional view of a semiconductor device according to some embodiments of the present disclosure.

FIG. 30 is a cross-sectional view of a semiconductor device according to some embodiments of the present disclosure.

Referring to FIG. 30, in a semiconductor device according to some embodiments of the present disclosure, a first source/drain region SD61 is in contact with the first active pattern 101, and a second source/drain region SD62 is in contact with the second active pattern 102.

For example, the first source/drain region SD61 extends through the first etch stop layer 611 in the vertical direction DR3 and into the first active pattern 101. For example, a vertical level of a bottom surface SD61*a* of the first source/drain region SD61 is lower than that of a bottom surface of the first etch stop layer 611. Further, the second source/drain region SD62 extends through the second etch stop layer 612 in the vertical direction DR3 and into the second active pattern 102. For example, a vertical level of a bottom surface SD62*a* of the second source/drain region SD62 is lower than that of a bottom surface of the second etch stop layer 612.

Although embodiments of the present disclosure have been described above with reference to the accompanying drawings, embodiments of the present disclosure are not limited to disclosed embodiments and can be implemented in various different forms. A person skilled in the art will be able to appreciate that embodiments of the present disclosure can be implemented in other specific forms without changing the technical spirit or essential characteristics of embodiments of the present disclosure. Therefore, it should be understood that embodiments as described above are not restrictive but illustrative in all respects.

What is claimed is:

1. A semiconductor device, comprising:
a substrate that includes a first region and a second region defined therein;
a first active pattern disposed on the first region of the substrate and extending in a first horizontal direction;
a second active pattern disposed on the second region of the substrate and extending in the first horizontal direction;
a first etch stop layer disposed on the first active pattern and including an insulating material;
a second etch stop layer disposed on the second active pattern and including an insulating material;
a plurality of first nanosheets disposed on the first etch stop layer, wherein the plurality of first nanosheets are stacked and spaced apart from each other in a vertical direction and include silicon germanium (SiGe);
a plurality of second nanosheets disposed on the second etch stop layer, wherein the plurality of second nanosheets are stacked and spaced apart from each other in the vertical direction;

a first gate electrode disposed on the first etch stop layer and extending in a second horizontal direction that differs from the first horizontal direction, wherein the first gate electrode surrounds the plurality of first nanosheets; and
a second gate electrode disposed on the second etch stop layer and extending in the second horizontal direction, wherein the second gate electrode surrounds the plurality of second nanosheets,
wherein a portion of the first gate electrode is disposed between the first etch stop layer and a lowermost first nanosheet in the vertical direction.

2. The semiconductor device of claim 1, wherein the first etch stop layer and the second etch stop layer are disposed at a same vertical level above the substrate.

3. The semiconductor device of claim 1, further comprising:
a first source/drain region disposed on the first active pattern and on at least one side surface of the first gate electrode, wherein a bottom surface of the first source/drain region is in contact with the first etch stop layer; and
a second source/drain region disposed on the second active pattern and on at least one side surface of the second gate electrode, wherein a bottom surface of the second source/drain region is in contact with the second etch stop layer.

4. The semiconductor device of claim 1, further comprising:
a first source/drain region disposed on the first active pattern and on at least one side surface of the first gate electrode, wherein the first source/drain region extends through the first etch stop layer and contacts the first active pattern; and
a second source/drain region disposed on the second active pattern and on at least one side surface of the second gate electrode, wherein the second source/drain region extends through the second etch stop layer and contacts the second active pattern.

5. The semiconductor device of claim 1, wherein the plurality of second nanosheets includes silicon (Si).

6. The semiconductor device of claim 1, wherein vertical levels above the substrate of the plurality of second nanosheets differ from vertical levels above the substrate of the plurality of first nanosheets.

7. The semiconductor device of claim 1, wherein a lowermost first nanosheet is spaced apart from the first etch stop layer in the vertical direction,
wherein a lowermost second nanosheet is in contact with the second etch stop layer.

8. The semiconductor device of claim 1, wherein the plurality of second nanosheets includes silicon germanium (SiGe).

9. The semiconductor device of claim 1, wherein the plurality of second nanosheets and the plurality of first nanosheets are disposed at a same vertical level above the substrate.

10. The semiconductor device of claim 1, wherein a lowermost first nanosheet is spaced apart from the first etch stop layer in the vertical direction,
wherein a lowermost second nanosheet is spaced apart from the second etch stop layer in the vertical direction.

11. The semiconductor device of claim 1, further comprising an inner spacer disposed between adjacent second nanosheets and on a sidewall in the first horizontal direction of the second gate electrode.

12. The semiconductor device of claim 1, wherein the first region is a PMOS region, and the second region is an NMOS region.

13. A semiconductor device, comprising:

a substrate that includes a PMOS region and a NMOS region formed therein;

a first active pattern disposed on the PMOS region of the substrate and extending in a first horizontal direction;

a second active pattern disposed on the NMOS region of the substrate and extending in the first horizontal direction;

a first etch stop layer disposed on the first active pattern and including an insulating material;

a second etch stop layer disposed on the second active pattern and including an insulating material, wherein the first and second etch stop layers have a same vertical level above the substrate;

a plurality of first nanosheets disposed on the first etch stop layer, wherein the plurality of first nanosheets are stacked and spaced apart from each other in a vertical direction and include silicon germanium (SiGe);

a plurality of second nanosheets disposed on the second etch stop layer, wherein the plurality of second nanosheets are stacked and spaced apart from each other in the vertical direction;

a first gate electrode disposed on the first etch stop layer and extending in a second horizontal direction that differs from the first horizontal direction, wherein the first gate electrode surrounds the plurality of first nanosheets;

a first source/drain region disposed on the first active pattern and on at least one side surface of the plurality of first nanosheets, wherein the first source/drain region is in contact with the first etch stop layer; and a second source/drain region disposed on the second active pattern and on at least one side surface of the plurality of second nanosheets, wherein the second source/drain region is in contact with the second etch stop layer, wherein a portion of the first gate electrode is disposed between the first etch stop layer and a lowermost first nanosheet in the vertical direction.

14. The semiconductor device of claim 13, wherein a bottom surface of the first source/drain region is in contact with the first etch stop layer, wherein a bottom surface of the second source/drain region is in contact with the second etch stop layer.

15. The semiconductor device of claim 13, wherein the plurality of second nanosheets includes silicon (Si).

16. The semiconductor device of claim 13, wherein vertical levels of the plurality of second nanosheets differ from vertical levels of the plurality of first nanosheets.

17. The semiconductor device of claim 13, wherein the plurality of second nanosheets includes silicon germanium (SiGe).

18. A semiconductor device, comprising:

A substrate that includes a PMOS region and a NMOS region formed therein;

a first active pattern disposed on the PMOS region of the substrate and extending in a first horizontal direction;

a second active pattern disposed on the NMOS region of the substrate and extending in the first horizontal direction;

a first etch stop layer disposed on the first active pattern and including an insulating material;

a second etch stop layer disposed on the second active pattern and including an insulating material, wherein the first and second etch stop layers have a same vertical level above the substrate;

a plurality of first nanosheets disposed on the first etch stop layer, wherein the plurality of first nanosheets are stacked and spaced apart from each other in a vertical direction and includes silicon germanium (SiGe);

a plurality of second nanosheets disposed on the second etch stop layer, wherein the plurality of second nanosheets are stacked and spaced apart from each other in the vertical direction and include silicon (Si), and vertical levels of the plurality of second nanosheets differ from vertical levels of the plurality of first nanosheets;

a first gate electrode disposed on the first etch stop layer and extending in a second horizontal direction that differs from the first horizontal direction, wherein the first gate electrode surrounds the plurality of first nanosheets;

a second gate electrode disposed on the second etch stop layer and extending in the second horizontal direction, wherein the second gate electrode surrounds the plurality of second nanosheets;

a first source/drain region disposed on the first active pattern and on at least one side surface of the first gate electrode, wherein the first source/drain region is in contact with the first etch stop layer; and a second source/drain region disposed on the second active pattern and on at least one side surface of the second gate electrode, wherein the second source/drain region is in contact with the second etch stop layer, wherein a portion of the first gate electrode is disposed between the first etch stop layer and a lowermost first nanosheet in the vertical direction.

19. The semiconductor device of claim 18, further comprising:

a first gate spacer in contact with an upper surface of an uppermost first nanosheet;

a second gate spacer spaced apart in the vertical direction from an upper surface of an uppermost second nanosheet; and an inner spacer disposed between the upper surface of the uppermost second nanosheet and the second gate spacer.

20. The semiconductor device of claim 19, wherein a portion of the second gate electrode disposed on the upper surface of the uppermost second nanosheet and between opposing portions of the second gate spacer contacts another portion of the second gate electrode disposed on the upper surface of the uppermost second nanosheet and is disposed between opposing portions of the inner spacer.

* * * * *